United States Patent
Ko et al.

(10) Patent No.: US 11,700,012 B2
(45) Date of Patent: Jul. 11, 2023

(54) DIGITAL-TO-ANALOG CONVERSION CIRCUIT AND RECEIVER INCLUDING THE SAME

(71) Applicant: SAMSUNG ELECTRONICS CO., LTD., Suwon-si (KR)

(72) Inventors: Kyeongjoon Ko, Yongin-si (KR); Junhan Bae, Hwaseong-si (KR); Hanseok Kim, Seoul (KR); Byeonggyu Park, Hwaseong-si (KR); Jaehyun Park, Seoul (KR); Hobin Song, Daejeon (KR); Sooeun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 18 days.

(21) Appl. No.: 17/306,421

(22) Filed: May 3, 2021

(65) Prior Publication Data

US 2022/0149863 A1 May 12, 2022

(30) Foreign Application Priority Data

Nov. 11, 2020 (KR) .................. 10-2020-0149930

(51) Int. Cl.
*H03M 1/74* (2006.01)
*H04B 1/16* (2006.01)
(Continued)

(52) U.S. Cl.
CPC ............ *H03M 1/742* (2013.01); *H03M 1/66* (2013.01); *H03M 7/165* (2013.01); *H04B 1/16* (2013.01)

(58) Field of Classification Search
CPC ........ H03M 1/66; H03M 1/742; H03M 7/165; H04L 25/03878; H04L 25/0276; H04B 1/16; H03L 7/0807
See application file for complete search history.

(56) References Cited

U.S. PATENT DOCUMENTS 6,703,956 B1 * 3/2004 Mueller ............... H03M 1/682
341/145
7,038,609 B1 5/2006 Hurrell
(Continued)

FOREIGN PATENT DOCUMENTS

JP 2008-278304 A 11/2008

OTHER PUBLICATIONS

DAC124S085, 12-Bit Micro Power Quad Digital-to-Analog Converter With Rail-to-Rail Output, Texas Instruments, Apr. 2006 (Year: 2006).*

*Primary Examiner* — Aristocratis Fotakis
(74) *Attorney, Agent, or Firm* — Sughrue Mion, PLLC

(57) ABSTRACT

A digital-to-analog conversion circuit includes a first digital-to-analog converter (DAC) and a second DAC. The first DAC includes a first current generation circuit (CGC) and a first current-to-voltage converter. The first CGC generates a first current based on a first digital code received through a first terminal to provide the first current to an output node. The second DAC includes a second CGC and a second current-to-voltage converter. The second CGC generates a second current based on a second digital code received through a second input terminal to provide the second current to the output node. The first current-to-voltage converter and the second current-to-voltage converter convert a sum of the first current and the second current to a an analog voltage corresponding to a sum of the first digital code and the second digital code, and output the analog voltage at the output node.

18 Claims, 20 Drawing Sheets

(51) Int. Cl.
   *H04L 25/03* (2006.01)
   *H03M 1/66* (2006.01)
   *H03M 7/16* (2006.01)

(56) References Cited

U.S. PATENT DOCUMENTS

| | | | |
|---|---|---|---|
| 8,165,549 B2 | 4/2012 | Pozsgay et al. | |
| 8,723,711 B1 * | 5/2014 | Bushey | H03K 4/026 |
| | | | 327/131 |
| 8,976,855 B2 | 3/2015 | Xu et al. | |
| 9,112,528 B1 | 8/2015 | Currivan | |
| 9,806,729 B1 * | 10/2017 | Razzaghi | H03M 1/0612 |
| 10,069,658 B2 | 9/2018 | Latif et al. | |
| 10,425,099 B1 * | 9/2019 | Aouini | H03M 3/50 |
| 10,454,487 B1 * | 10/2019 | Sedighi | H03M 1/742 |
| 10,615,817 B2 | 4/2020 | Downey | |
| 2006/0139193 A1 * | 6/2006 | Morrow | H03M 3/34 |
| | | | 341/143 |
| 2009/0251156 A1 * | 10/2009 | Jasa | G01R 27/205 |
| | | | 324/704 |
| 2014/0253350 A1 * | 9/2014 | Imai | H03M 1/0617 |
| | | | 341/118 |
| 2017/0041014 A1 * | 2/2017 | Shrivastava | H03M 1/1009 |
| 2019/0036541 A1 * | 1/2019 | Wong | H03M 1/747 |
| 2020/0158808 A1 * | 5/2020 | Newlin | G01R 35/005 |

* cited by examiner

FIG. 19

| DCD1 | TC1 | TC1B |
|---|---|---|
| 000 | 0000000 | 1111111 |
| 001 | 0000001 | 1111110 |
| 010 | 0000011 | 1111100 |
| 011 | 0000111 | 1111000 |
| 100 | 0001111 | 1110000 |
| 101 | 0011111 | 1100000 |
| 110 | 0111111 | 1000000 |
| 111 | 1111111 | 0000000 |

DIGITAL-TO-ANALOG CONVERSION CIRCUIT AND RECEIVER INCLUDING THE SAME

CROSS-REFERENCE TO RELATED APPLICATION

This application is based on and claims priority under 35 U.S.C. § 119 to Korean Patent Application No. 10-2020-0149930, filed on Nov. 11, 2020 in the Korean Intellectual Property Office (KIPO), the disclosure of which is incorporated by reference herein in its entirety.

BACKGROUND

1. Field

One or more embodiments relate to integrated circuits, and more particularly, to digital-to-analog conversion circuits and receivers including the same.

2. Description of the Related Art

Digital-to-analog converters (DAC)s are widely used in various integrated circuits such as transmitters and receivers. Generally, digital codes input to different input terminals are converted to analog signals by different DACs, and then the converted analog signals are summed by a circuit element connected to the DACs. Because the digital codes are converted and summed in various steps involving numerous circuit elements, design complexity of the integrated circuit is increased. Therefore, there is a need for reducing the number of circuit elements for summing analog signals of respective digital codes in order to enhance spatial capacity and reduce design complexity of an integrated circuit.

SUMMARY

Some example embodiments provide a digital-to-analog conversion circuit capable of outputting an analog voltage corresponding to a sum of two digital codes input to two input terminals.

Some example embodiments provide a digital-to-analog conversion circuit capable of outputting an analog voltage corresponding to a weighted sum of two digital codes input to two input terminals.

Some example embodiments provide a receiver including the digital-to-analog conversion circuit.

According to an embodiment, there is provided a digital-to-analog conversion circuit including a first digital-to-analog converter (DAC) and a second DAC. The first DAC includes: a first binary-to-thermometer code converter (BTC) configured to convert a first digital code received through a first input terminal to a first thermometer code; a plurality of first current cells connected between a first voltage source and a first output node, and configured to provide a first current to the first output node based on the first thermometer code; and a first current-to-voltage converter connected between the first output node and a second voltage source. The second DAC includes: a second BTC configured to convert a second digital code received through a second input terminal to a second thermometer code; a plurality of second current cells connected between the first voltage source and the first output node in parallel with the plurality of first current cells, and configured to provide a second current to the first output node based on the second thermometer code; and a second current-to-voltage converter connected between the first output node and the second voltage source in parallel with the first current-to-voltage converter. The first current-to-voltage converter and the second current-to-voltage converter are configured to convert a sum of the first current and the second current to a first analog voltage corresponding to a weighted sum of the first digital code and the second digital code, and output the first analog voltage at the first output node.

According to an embodiment, there is provided a digital-to-analog conversion circuit including: a first digital-to-analog converter (DAC) and a second DAC. The first DAC includes: a first current generation circuit (CGC) connected between a first voltage source and an output node, and configured to generate a first current based on a first digital code received through a first input terminal to provide the first current to the output node; and a first current-to-voltage converter connected between the output node and a second voltage source. The second DAC includes: a second CGC connected between the first voltage source and the output node in parallel with the first CGC, and configured to generate a second current based on a second digital code received through a second input terminal to provide the second current to the output node; and a second current-to-voltage converter connected between the output node and the second voltage source in parallel with the first current-to-voltage converter. The first current-to-voltage converter and the second current-to-voltage converter are configured to convert a sum of the first current and the second current to a an analog voltage corresponding to a sum of the first digital code and the second digital code, and output the analog voltage at the output node.

According to an embodiment, there is provided a receiver including: a sampling circuit configured to perform sampling on first voltage levels corresponding to a first logical value of data and second voltage levels corresponding to a second logical value of the data, based on a sampling clock signal; an equalizer configured to receive and adjust the first voltage levels and the second voltage levels; and a clock and data recovery circuit configured to recover the sampling clock signal, based on the first voltage levels and the second voltage levels received from the equalizer. The sampling circuit includes: a data sampler and an error sampler having a same configuration; a first digital-to-analog converter (DAC) configured to convert a first digital code associated with an offset voltage to an analog offset voltage; and a digital-to-analog conversion circuit including a second DAC and a third DAC, the second DAC being configured to convert the first digital code to a first analog voltage and the third DAC being configured to convert a second digital code associated with a reference voltage to a second analog voltage. The digital-to-analog conversion circuit is configured to output a summed analog voltage corresponding to the first digital code and the second digital code.

Accordingly, the digital-to-analog conversion circuit sums, at an output node, a first analog signal and a second analog signal respectively corresponding to a first digital code and a second digital code received through different input terminals and provides one analog signal. Therefore, design of circuit elements connected to an output node of the digital-to-analog conversion circuit may be simplified.

BRIEF DESCRIPTION OF THE DRAWINGS

The above and other aspects, features and advantages of certain embodiments of the disclosure will be more apparent from the following description taken in conjunction with the accompanying drawings.

FIG. 19 illustrates an example of the first digital code, the first thermometer code and the first inverted thermometer code in the digital-to-analog conversion circuit of FIG. 12.

DETAILED DESCRIPTION

One or more embodiments of the disclosure will be described in more detail with reference to the accompanying drawings, in which the one or more embodiments are shown.

Figure 1:
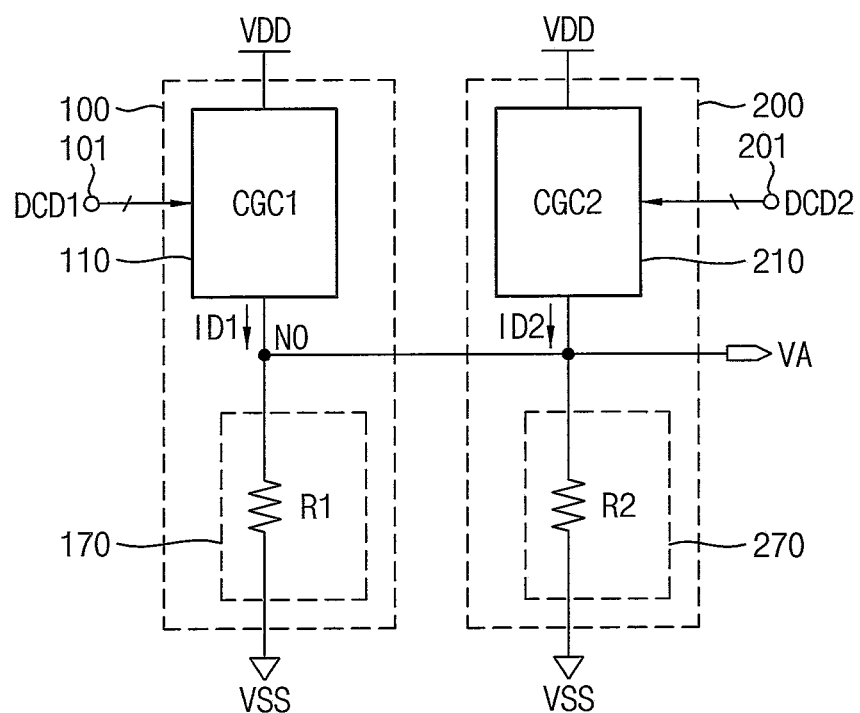
FIG. 1 is a block diagram illustrating a digital-to-analog conversion circuit according to an embodiment.

FIG. 1 is a block diagram illustrating a digital-to-analog conversion circuit according to an embodiment.

Referring to FIG. 1, a digital-to-analog conversion circuit 10 may include a first digital-to-analog converter (DAC) 100 and a second DAC 200.

The first DAC 100 may include a first current generation circuit (CGC) 110 (CGC1) and a first current-to-voltage converter 170.

The first CGC 110 may be connected between a first voltage source (a power supply voltage source VDD) and an output node NO. The first CGC 110 may generate a first current ID1 in response to a first digital code DCD1 received through a first input terminal 101 and may provide the first current ID1 to the output node NO. The first current-to-voltage converter 170 may be connected between the output node NO and a second voltage source VSS (or a ground voltage source VSS). The first current-to-voltage converter 170 may include a first resistor R1 connected between the output node NO and the ground voltage VSS.

The second DAC 200 may include a second CGC 210 (CGC2) and a second current-to-voltage converter 270.

The second CGC 210 may be connected between the power supply voltage VDD and the output node NO, and in parallel with the first CGC 110. The second CGC 210 may generate a second current ID2 in response to a second digital code DCD2 received through a second input terminal 201 and may provide the second current ID2 to the output node NO. The second current-to-voltage converter 270 may be connected between the output node NO and the ground voltage VSS in parallel with the first current-to-voltage converter 170. The second current-to-voltage converter 270 may include a second resistor R2 connected between the output node NO and the ground voltage VSS.

The first current-to-voltage converter 170 and the second current-to-voltage converter 270 may convert a sum of the first current ID1 and the second current ID2 to an analog voltage VA corresponding to a sum of the first digital code DCD1 and the second digital code DCD2, and output the analog voltage VA at the output node NO.

The first current-to-voltage converter 170 and the second current-to-voltage converter 270 may include the same circuit elements, such as operational amplifier (op-amp) circuit and one or more resistors. However, the first current-to-voltage converter 170 and the second current-to-voltage converter 270 are not limited thereto, and may include different circuit elements.

Figure 2:
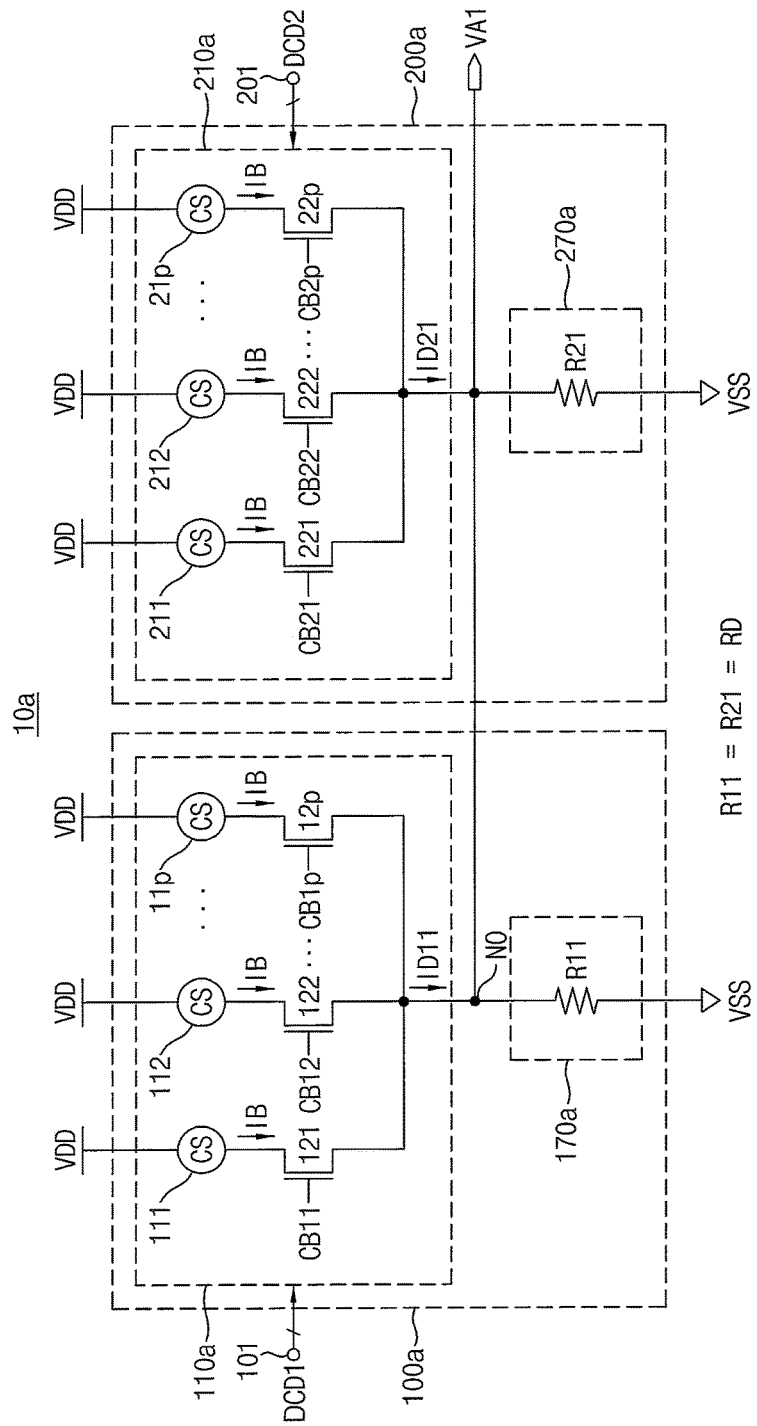
FIG. 2 is a circuit diagram illustrating an example of the digital-to-analog conversion circuit of FIG. 1 according to an embodiment.

FIG. 2 is a circuit diagram illustrating an example of the digital-to-analog conversion circuit of FIG. 1 according to an embodiment.

Referring to FIG. 2, a digital-to-analog conversion circuit 10a may include a first DAC 100a and a second DAC 200a.

The first DAC 100a may include a first CGC 110a and a first current-to-voltage converter 170a.

The first CGC 110a may be connected between the power supply voltage VDD and the output node NO. The first CGC 110a may generate a first current ID11 in response to the first digital code DCD1 received through the first input terminal 101 and may provide the first current ID11 to the output node NO. The first current-to-voltage converter 170a may be connected between the output node NO and the ground voltage VSS. The first current-to-voltage converter 170a may include a first resistor R11 connected between the output node NO and the ground voltage VSS.

The first CGC 110a may include a plurality of first current sources 111 to 11p (where, p is a natural number equal to or greater than three), and a plurality of first transistors 121 to 12p. The first current sources 111 to 11p may be connected to the power supply voltage VDD in parallel with respect to each other, and each of the first current sources 111 to 11p may provide a base current IB. A plurality of first transistors 121 to 12p may be connected between respective one of the first current sources 111 to 11p and the output node NO, and in parallel with respect to each other. Each gate of the first transistors 121 to 12p may receive respective bit of bits CB11 to CB1p of the first digital code DCD1. Each of the first transistors 121 to 12p is selectively turned-on/turned-off in response to the respective bit of bits CB11 to CB1p of the first digital code DCD1 to provide the base current IB to the output node NO. A magnitude of the first current ID11 may be determined based on a number of transistors which are turned-on from among the first transistors 121 to 12p. Each of the first transistors 121 to 12p may be implemented with an n-channel metal-oxide semiconductor (NMOS) transistor.

The second DAC 200a may include a second CGC 210a and a second current-to-voltage converter 270a.

The second CGC 210a may be connected between the power supply voltage VDD and the output node NO, and in parallel with the first CGC 110a. The second CGC 210a may generate a second current ID21 in response to the second digital code DCD2 received through the second input terminal 201 and may provide the second current ID21 to the output node NO. The second current-to-voltage converter 270a may be connected between the output node NO and the ground voltage VSS, and in parallel with the first current-to-voltage converter 170a. The second current-to-voltage converter 270a may include a second resistor R21 connected between the output node NO and the ground voltage VSS.

The second CGC 210a may include a plurality of second current sources 211 to 21p, and a plurality of second transistors 221 to 22p. The second current sources 211 to 21p may be connected to the power supply voltage VDD in parallel with respect to each other, and each of the second current sources 211 to 21p may provide the base current IB. A plurality of second transistors 221 to 22p may be connected between respective one of the second current sources 211 to 21p and the output node NO, and in parallel with respect to each other. Each gate of the second transistors 221 to 22p may receive respective bit of bits CB21 to CB2p of the second digital code DCD2. Each of the second transistors 221 to 22p is selectively turned-on/turned-off in response to the respective bit of bits CB21 to CB2p of the second digital code DCD2 to provide the base current IB to the output node NO. A magnitude of the second current ID21 may be determined based on a number of transistors which are turned-on from among the second transistors 221 to 22p. Each of the second transistors 221 to 22p may be implemented with an NMOS transistor.

The first current-to-voltage converter 170a and the second current-to-voltage converter 270a may convert a sum of the first current ID11 and the second current ID21 to an analog voltage VA1 corresponding to a sum of the first digital code DCD1 and the second digital code DCD2, and output the analog voltage VA1 at the output node NO.

Since each of the first current sources 111 to 11p and each of the second current sources 211 to 21p generate the same base current IB, the first CGC 110a and the second CGC 210a may generate a current having the same magnitude when the first digital code DCD1 is the same as the second digital code DCD2. When first digital code DCD1 is the same as the second digital code DCD2, a magnitude of the first current ID11 is the same as a magnitude of the second current ID21. However, the one or more embodiments are not limited thereto, and digital codes may have different codes.

In addition, a resistance of the first resistor R11 may be the same as a resistance of the second resistor R21. However, the one or more embodiments are not limited thereto, and a resistance of one or more resistors may be variously implemented.

Figure 3:
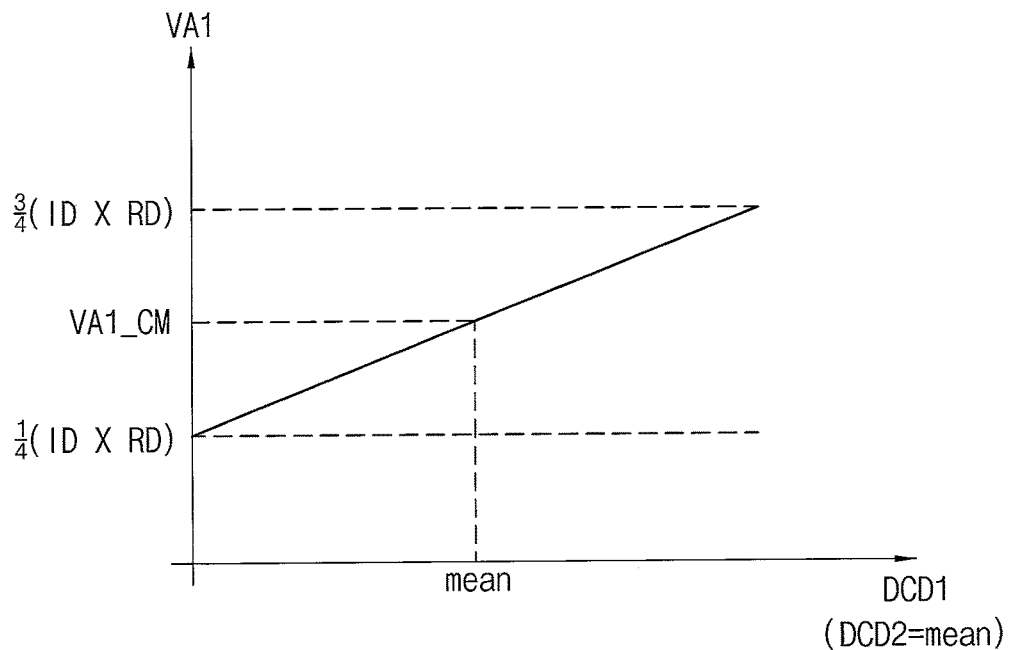
FIG. 3 is a graph illustrating an analog voltage according to a change of first digital code in the digital-to-analog conversion circuit of FIG. 2.

FIG. 3 is a graph illustrating an analog voltage according to a change of the first digital code in the digital-to-analog conversion circuit of FIG. 2.

In FIG. 3, it is assumed that the second digital code DCD2 has a mean value.

When first digital code DCD1 is the same as the second digital code DCD2, a magnitude of the first current ID11 is the same as a magnitude of the second current ID21 as described with reference to FIG. 2. For example, it may be assumed that each of the first CGC 110a and the second CGC 210a may generate a current corresponding to ID/2 when the first digital code DCD1 and the second digital DCD2 have a mean value and each of the first resistor R11 and the second resistor R12 has a resistance RD. Here, the mean value may refer to a mean of the first current ID and the second current ID2.

Referring to FIG. 3, when the first digital code DCD1 has a minimum value, the first current ID11 corresponds to '0' and the first resistor R11 and the second resistor R12 are connected in parallel with respect to the output node NO. Here, the analog voltage VA1 has a value corresponding to ID*RD/4. In addition, when the first digital code DCD1 has a maximum value, the first current ID11 corresponds to 'ID' and the analog voltage VA1 has a value corresponding to 3(ID*RD)/4. In FIG. 3, VA1_CM represents a common mode voltage when the first digital code DCD1 and the second digital DCD2 have the mean value.

Figure 4:
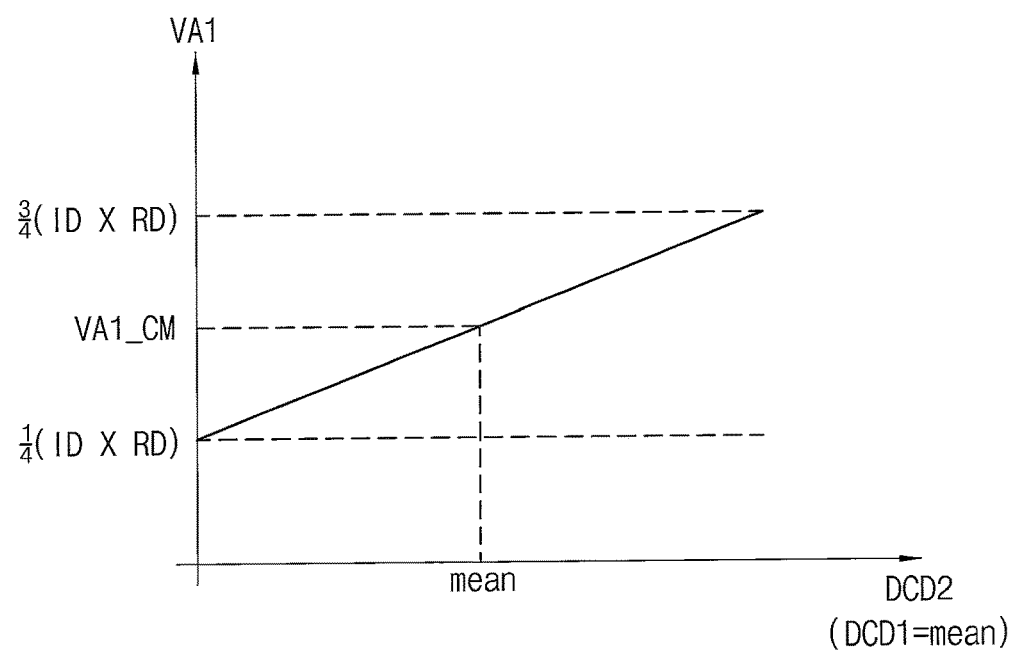
FIG. 4 is a graph illustrating an analog voltage according to a change of second digital code in the digital-to-analog conversion circuit of FIG. 2.

FIG. 4 is a graph illustrating an analog voltage according to a change of the second digital code in the digital-to-analog conversion circuit of FIG. 2.

In FIG. 4, it is assumed that the first digital code DCD1 has a mean value.

When first digital code DCD1 is the same as the second digital code DCD2, a magnitude of the first current ID11 is the same as a magnitude of the second current ID21 as described with reference to FIG. 2. It is assumed that each of the first CGC 110a and the second CGC 210a may generate a current corresponding to ID/2 when the first digital code DCD1 and the second digital DCD2 have the mean value and each of the first resistor R11 and the second resistor R12 has a resistance RD.

Referring to FIG. 4, when the second digital code DCD2 has a minimum value, the second current ID21 corresponds to '0' and the first resistor R11 and the second resistor R12 are connected in parallel with respect to the output node NO. Here, the analog voltage VA1 has a value corresponding to ID*RD/4. In addition, when the second digital code DCD2 has a maximum value, the second current ID21 corresponds to 'ID' and the analog voltage VA1 has a value corresponding to 3(ID*RD)/4. In FIG. 4, VA1_CM represents a common mode voltage when the first digital code DCD1 and the second digital DCD2 have the mean value.

Referring to FIGS. 3 and 4, each of the first digital code DCD1 and the second digital code DCD2 may approximately represent one-half (½) portion of a maximum output range of the analog voltage VA1. In other words, the first digital code DCD1 and the second digital code DCD2 may be variously applied to the plurality of first transistors 121 to 12p and the plurality of second transistors 221 to 22p, respectively, such that a sum of a first voltage of the first DAC 100*a* and a second voltage of the second DAC 200*a* is equal to the maximum output range of the analog voltage VA1.

Figure 5:
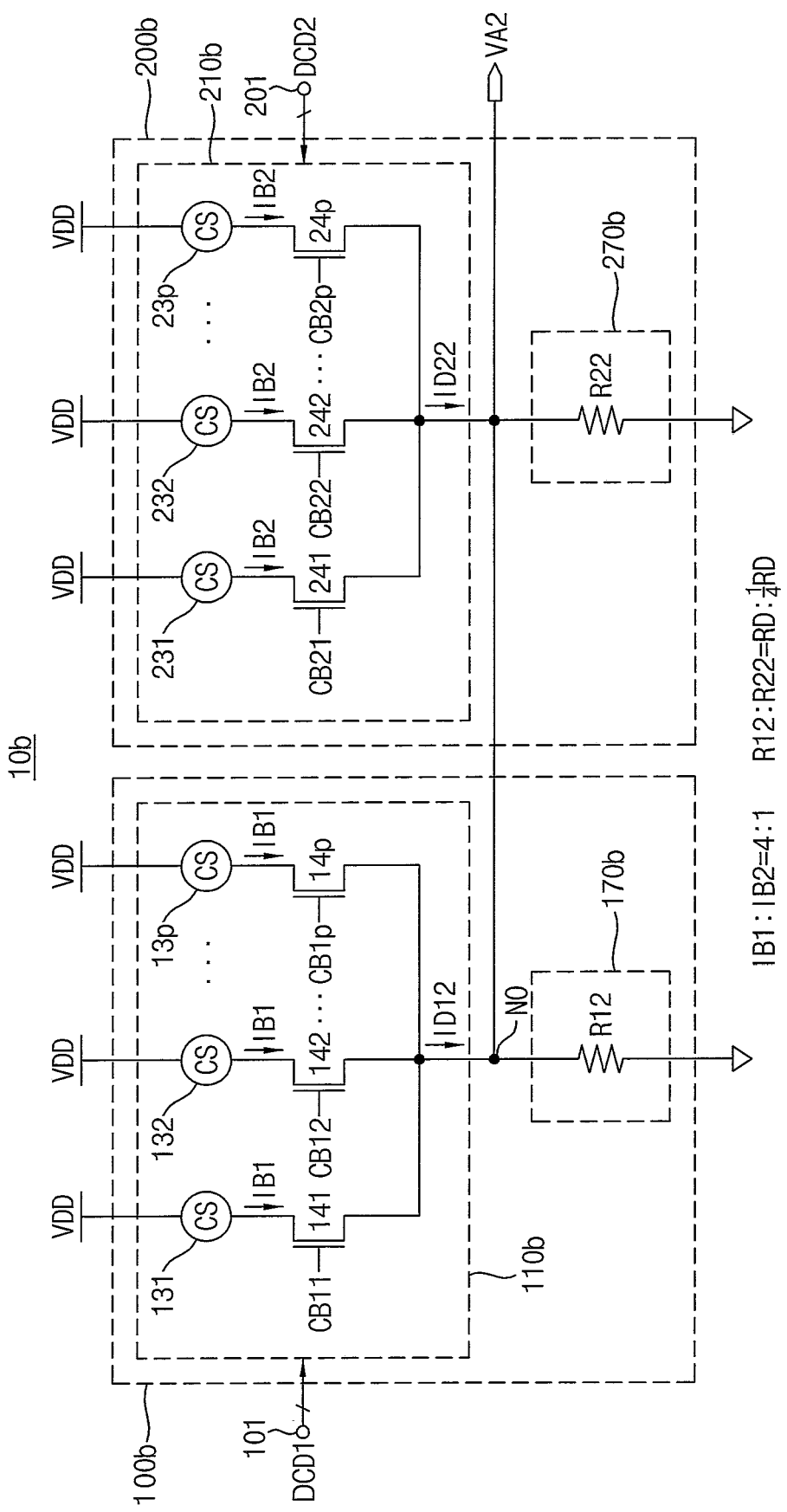
FIG. 5 is a circuit diagram illustrating an example of the digital-to-analog conversion circuit of FIG. 1 according to an embodiment.

FIG. 5 is a circuit diagram illustrating an example of the digital-to-analog conversion circuit of FIG. 1 according to an embodiment.

Referring to FIG. 5, a digital-to-analog conversion circuit 10*b* may include a first DAC 100*b* and a second DAC 200*b*.

The first DAC 100*b* may include a first CGC 110*b* and a first current-to-voltage converter 170*b*.

The first CGC 110*b* may be connected between the power supply voltage VDD (a first voltage) and the output node NO. The first CGC 110*b* may generate a first current ID12 in response to the first digital code DCD1 received through the first input terminal 101 and may provide the first current ID12 to the output node NO. The first current-to-voltage converter 170*b* may be connected between the output node NO and the ground voltage VSS. The first current-to-voltage converter 170*b* may include a first resistor R12 connected between the output node NO and the ground voltage VSS.

The first CGC 110*b* may include a plurality of first current sources 131 to 13*p*, and a plurality of first transistors 141 to 14*p*. The first current sources 131 to 13*p* may be connected to the power supply voltage VDD in parallel with respect to each other, and each of the first current sources 131 to 13*p* may provide a first base current IB1. The first transistors 141 to 14*p* may be connected between respective one of the first current sources 131 to 13*p* and the output node NO in parallel with respect to each other, and each gate of the first transistors 141 to 14*p* may receive respective bit of bits CB11 to CB1*p* of the first digital code DCD1. Each of the first transistors 141 to 14*p* is selectively turned-on/turned-off in response to the respective bit of bits CB11 to CB1*p* of the first digital code DCD1 to provide the first base current IB1 to the output node NO. A magnitude of the first current ID12 may be determined based on a number of transistors which are turned-on from among the first transistors 141 to 14*p*. Each of the first transistors 141 to 14*p* may be implemented with an NMOS transistor.

The second DAC 200*b* may include a second CGC 210*b* and a second current-to-voltage converter 270*b*.

The second CGC 210*b* may be connected between the power supply voltage VDD and the output node NO in parallel with the first CGC 110*b*. The second CGC 210*b* may generate a second current ID22 in response to the second digital code DCD2 received through the second input terminal 201 and may provide the second current ID22 to the output node NO. The second current-to-voltage converter 270*b* may be connected between the output node NO and the ground voltage VSS in parallel with the first current-to-voltage converter 170*b*. The second current-to-voltage converter 270*b* may include a second resistor R22 connected between the output node NO and the ground voltage VSS.

The second CGC 210*b* may include a plurality of second current sources 231 to 23*p*, and a plurality of first transistors 241 to 24*p*. The second current sources 231 to 23*p* may be connected to the power supply voltage VDD in parallel with respect to each other and each of the second current sources 231 to 23*p* may provide a second base current IB2. The second transistors 241 to 24*p* may be connected between respective one of the second current sources 231 to 23*p* and the output node NO in parallel with respect to each other, and each gate of the second transistors 241 to 24*p* may receive respective bit of bits CB21 to CB2*p* of the second digital code DCD2. Each of the second transistors 241 to 24*p* is selectively turned-on/turned-off in response to the respective bit of bits CB21 to CB2*p* of the second digital code DCD2 to provide the base current IB to the output node NO. A magnitude of the second current ID22 may be determined based on a number of transistors which are turned-on from among the second transistors 241 to 24*p*. Each of the second transistors 241 to 24*p* may be implemented with an NMOS transistor. However, the one or more embodiments are not limited thereto, and the transistors 241 to 24*p* may include PMOS transistors or the like.

The first current-to-voltage converter 170*b* and the second current-to-voltage converter 270*b* may convert a sum of the first current ID12 and the second current ID22 to an analog voltage VA2 corresponding to a sum of the first digital code DCD1 and the second digital code DCD2, and output the analog voltage VA2 at the output node NO.

Each of the first current sources 131 to 13*p* generates the first base current each of the second current sources 231 to 23*p* generates the second base current IB2, and the first base current IB1 and the second base current IB2 may have a ratio of c:d (where c and d are positive real numbers). When the first digital code DCD1 is the same as the second digital code DCD2, the first CGC 110*b* and the second CGC 210*b* may generate currents having a ratio of c:d. When the first digital code DCD1 is the same as the second digital code DCD2, a magnitude of the first current ID12 and a magnitude of the first current ID22 have a ratio of c:d.

In addition, a resistance of the first resistor R12 and a resistance of the second resistor R22 may have a ratio of 1/c:1/d. In FIG. 4, it is assumed that c is '4' and d is '1'. The first resistor R12 has a resistance of RD and the second resistor R22 has a resistance of RD/4.

Therefore, the analog voltage VA2 may have a weighted sum of the first digital code DCD1 and the second digital code DCD2 with a ratio of c:d.

Figure 6A:
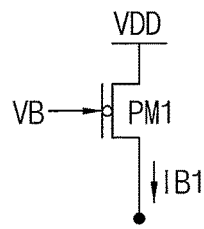
FIG. 6A is a circuit diagram illustrating an example of a first current source in FIG. 5.

FIG. 6A illustrates an example of one of the first current sources in FIG. 5.

FIG. 6A illustrates a configuration of a current source 131 from among the first current sources 131 to 13*p*, and each of the first current sources 131 to 13*p* may have substantially the same configuration.

Referring to FIG. 6A, the current source 131 may include a p-channel metal-oxide semiconductor (PMOS) transistor PM1. The PMOS transistor PM1 may have a source coupled to the power supply voltage VDD, a gate configured to receive a bias voltage VB and a drain providing the first base current IB1 to a transistor 141 among the plurality of first transistor 141 to 14*p* shown in FIG. 5.

Figure 6B:
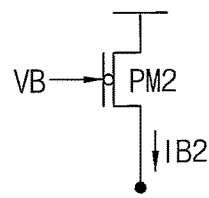
FIG. 6B is a circuit diagram illustrating an example of a second current source in FIG. 5.

FIG. 6B illustrates an example of one of the second current sources in FIG. 5.

FIG. 6B illustrates a configuration of a current source 231 from among the second current sources 231 to 23*p*, and each of the first current sources 231 to 23*p* may have substantially the same configuration.

Referring to FIG. 6B, the current source 231 may include a PMOS transistor PM2. The PMOS transistor PM2 may have a source coupled to the power supply voltage VDD, a gate configured to receive the bias voltage VB and a drain providing the second base current IB2 to a transistor 241 among the plurality of second transistor transistors 241 to 24*p* shown in FIG. 5.

Referring to FIGS. 6A and 6B, a driving capability of the current source 131 and a driving capability of the current source 231 may have a ratio of c:d.

Figure 7:
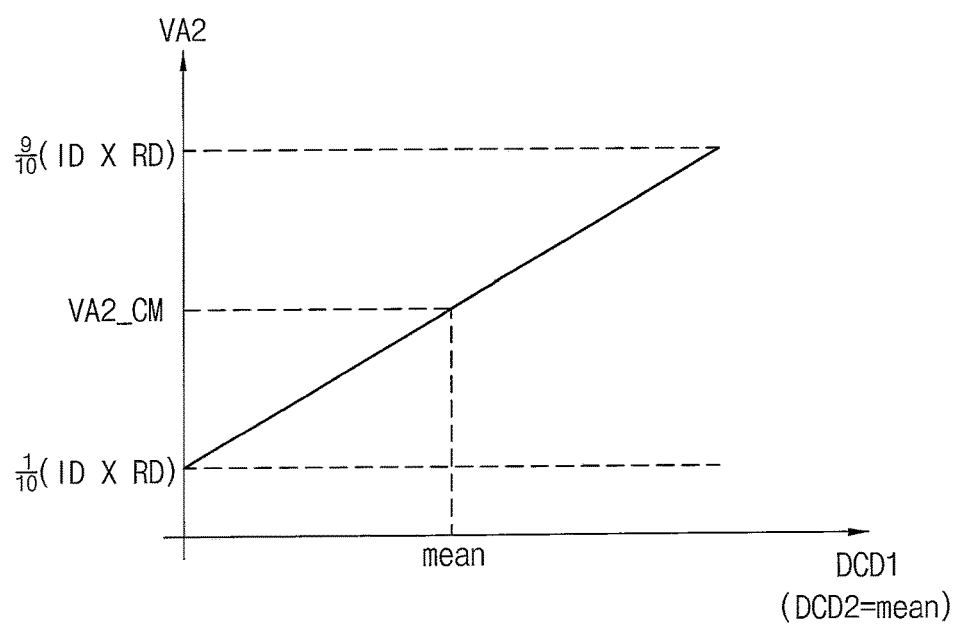
FIG. 7 is a graph illustrating an analog voltage according to a change of the first digital code in the digital-to-analog conversion circuit of FIG. 5.

FIG. 7 is a graph illustrating an analog voltage according to a change of the first digital code in the digital-to-analog conversion circuit of FIG. 5.

In FIG. 7, it is assumed that the second digital code DCD2 has a mean value.

When first digital code DCD1 is the same as the second digital code DCD2, the first CGC 110b and the second CGC 210a may generate currents having a ratio of 4:1 as described with reference to FIG. 5. It is assumed that each of the first CGC 110b and the second CGC 210b may generate currents corresponding to 2ID and ID/2, respectively, when the first digital code DCD1 and the second digital DCD2 have the mean value.

Referring to FIG. 7, when the first digital code DCD1 has a minimum value, the first current ID12 corresponds to '0' and the first resistor R12 and the second resistor R22 are connected in parallel with respect to the output node NO. Therefore, the analog voltage VA2 has a value corresponding to ID*RD/10. In addition, when the first digital code DCD1 has a maximum value, the first current ID12 corresponds to '4ID' and the analog voltage VA2 has a value corresponding to 9(ID*RD)/10.

Figure 8:
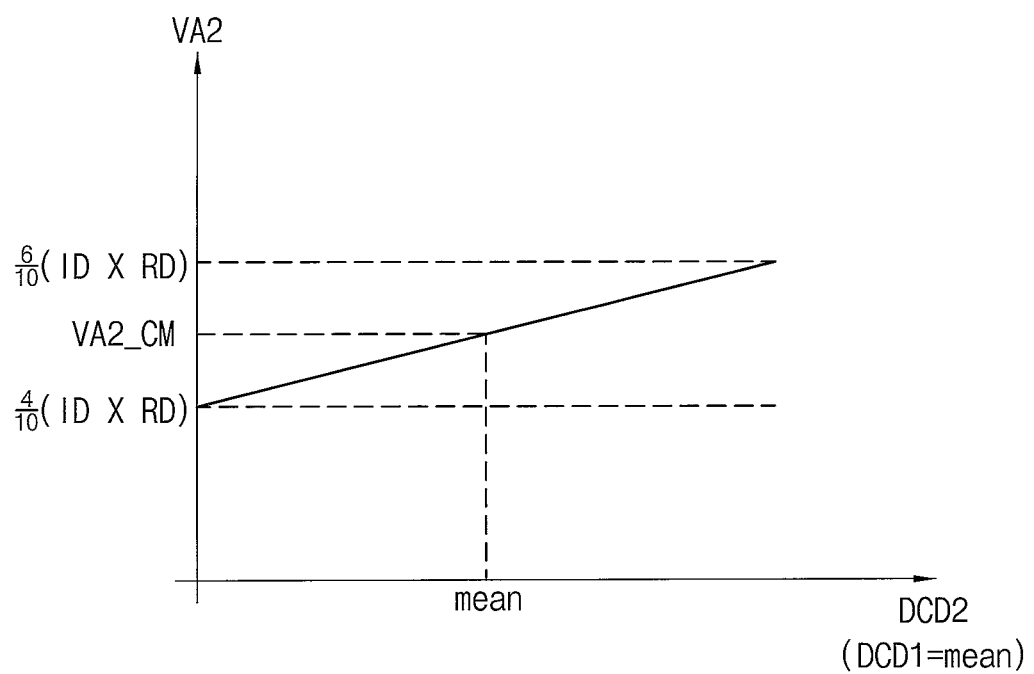
FIG. 8 is a graph illustrating an analog voltage according to a change of the second digital code in the digital-to-analog conversion circuit of FIG. 5.

FIG. 8 is a graph illustrating an analog voltage according to a change of the second digital code in the digital-to-analog conversion circuit of FIG. 5.

In FIG. 8, it is assumed that the first digital code DCD1 has a mean value.

When first digital code DCD1 is the same as the second digital code DCD2, the first CGC 110b and the second CGC 210b may generate currents having a ratio of 4:1 as described with reference to FIG. 5. It is assumed that each of the first CGC 110b and the second CGC 210b may generate currents corresponding to 2ID and ID/2, respectively, when the first digital code DCD1 and the second digital DCD2 have the mean value.

Referring to FIG. 8, when the second digital code DCD2 has a minimum value, the second current ID22 corresponds to '0' and the first resistor R12 and the second resistor R22 are connected in parallel with respect to the output node NO. Therefore, the analog voltage VA2 has a value corresponding to 4(ID*RD)/10. In addition, when the second digital code DCD2 has a maximum value, the second current ID22 corresponds to 'ID' and the analog voltage VA2 has a value corresponding to 6(ID*RD)/10.

In FIGS. 7 and 8, VA2_CM represents a common mode voltage when the first digital code DCD1 and the second digital DCD2 have the mean value.

Figure 9:
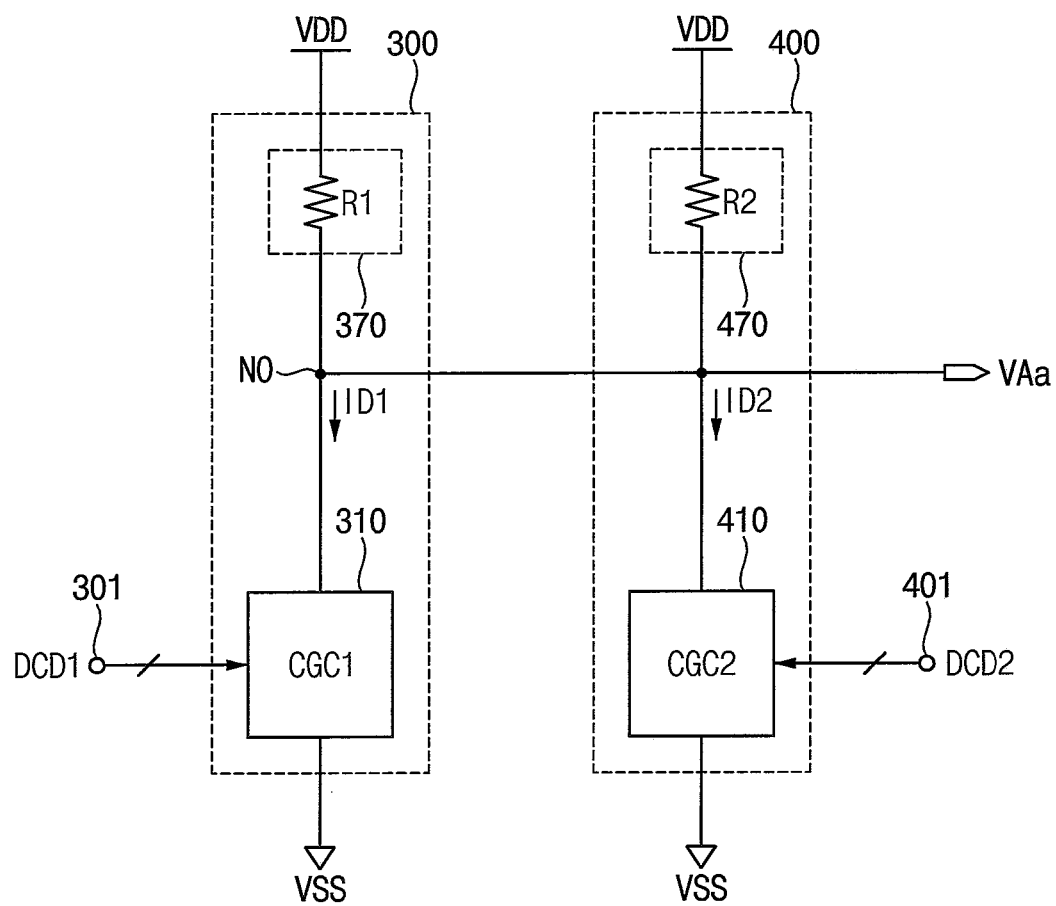
FIG. 9 is a block diagram illustrating a digital-to-analog conversion circuit according to an embodiment.

FIG. 9 is a block diagram illustrating a digital-to-analog conversion circuit according to an embodiment.

Referring to FIG. 9, a digital-to-analog conversion circuit 20 may include a first DAC 300 and a second DAC 400.

The first DAC 300 may include a first CGC 310 (CGC1) and a first current-to-voltage converter 370.

The first CGC 310 may be connected between a first voltage (a ground voltage VSS) and an output node NO. The first CGC 310 may generate a first current ID1 in response to a first digital code DCD1 received through a first input terminal 301 and may provide the first current ID1 to the output node NO. The first current-to-voltage converter 370 may be connected between the output node NO and a second voltage (a power supply voltage VSS). The first current-to-voltage converter 370 may include a first resistor R1 connected between the output node NO and the power supply voltage VDD.

The second DAC 400 may include a second CGC 410 (CGC2) and a second current-to-voltage converter 470.

The second CGC 410 may be connected between output node NO and the ground voltage VSS in parallel with the first CGC 310. The second CGC 410 may generate a second current ID2 in response to a second digital code DCD2 received through a second input terminal 401 and may provide the second current ID2 to the output node NO. The second current-to-voltage converter 470 may be connected between the power supply voltage VDD and the output node NO in parallel with the first current-to-voltage converter 370. The second current-to-voltage converter 470 may include a second resistor R2 connected between the power supply voltage VDD and the output node NO.

The first current-to-voltage converter 370 and the second current-to-voltage converter 470 may convert a sum of the first current ID1 and the second current ID2 to an analog voltage VAa corresponding to a sum of the first digital code DCD1 and the second digital code DCD2, and output the analog voltage VAa at the output node NO.

Figure 10:
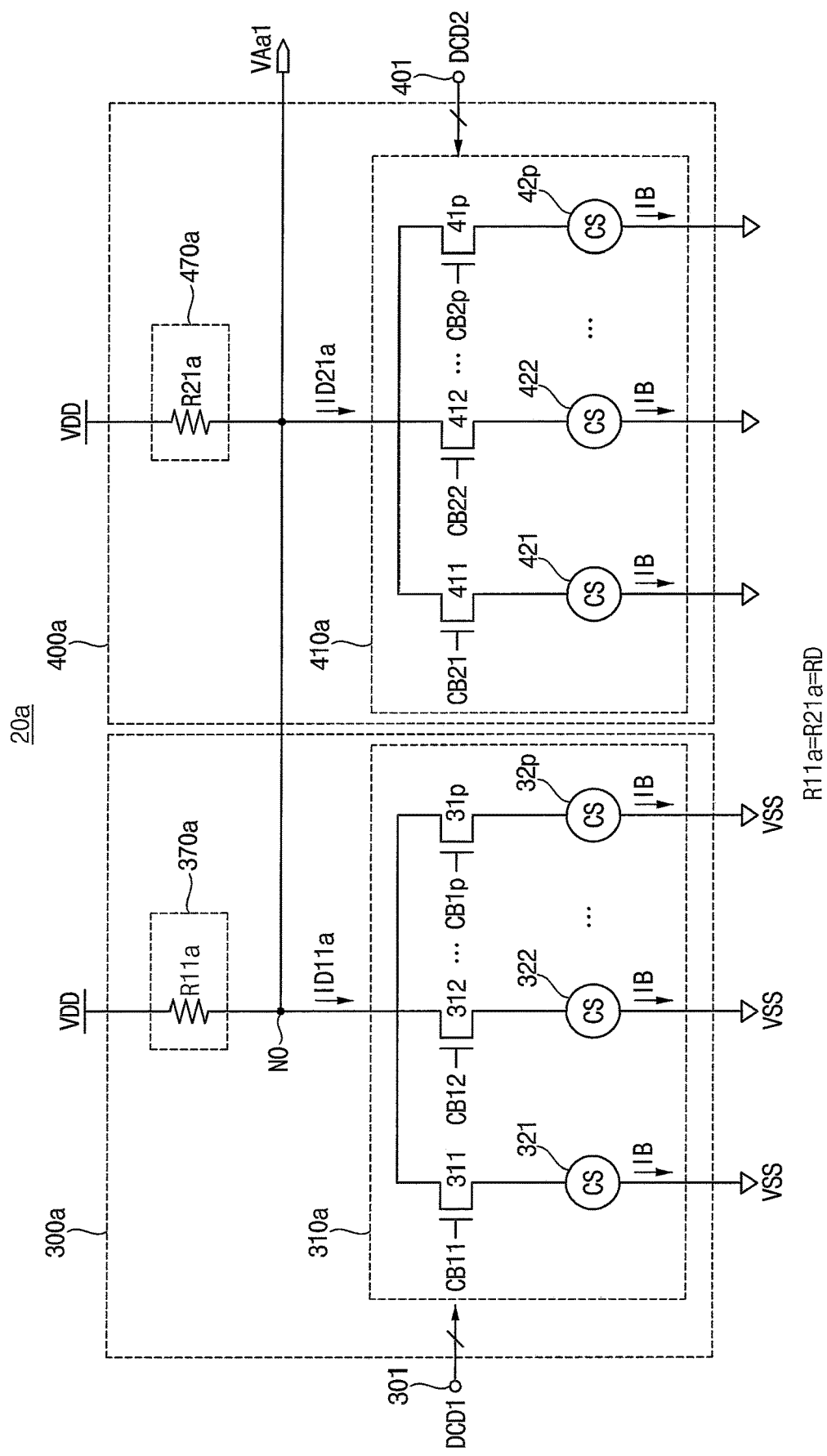
FIG. 10 is a circuit diagram illustrating an example of the digital-to-analog conversion circuit of FIG. 9 according to an embodiment.

FIG. 10 is a circuit diagram illustrating an example of the digital-to-analog conversion circuit of FIG. 9 according to an embodiment.

Referring to FIG. 10, a digital-to-analog conversion circuit 20a may include a first DAC 300a and a second DAC 400a.

The first DAC 300a may include a first CGC 310a and a first current-to-voltage converter 370a.

The first CGC 310a may be connected between the output node NO and the ground voltage VSS. The first CGC 310a may generate a first current ID11a in response to the first digital code DCD1 received through the first input terminal 301 and may provide the first current ID11a to the output node NO. The first current-to-voltage converter 370a may be connected between the power supply voltage VDD and the output node NO. The first current-to-voltage converter 370a may include a first resistor R11a connected between the power supply voltage VDD and the output node NO.

The first CGC 310a may include a plurality of first transistors 311 to 31p, and a plurality of first current sources 321 to 32p. The first transistors 311 to 31p may be connected to the output node NO in parallel with respect to each other and each gate of the first transistors 311 to 31p may receive respective bit of bits CB11 to CB1p of the first digital code DCD1. Each of the first current sources 321 to 32p may be connected between respective one of the first transistors 311 to 31p and the ground voltage VSS in parallel with respect to each other, and each of the first current source 321 to 32p provides a base current IB. Each of the first transistors 311 to 31p is selectively turned-on/turned-off in response to the respective bit of bits CB11 to CB1p of the first digital code DCD1 to provide the base current IB to the output node NO. A magnitude of the first current ID11a may be determined based on a number of transistors which are turned-on from among the first transistors 311 to 31p. Each of the first transistors 311 to 31p may be implemented with an NMOS transistor.

The second DAC 400a may include a second CGC 410a and a second current-to-voltage converter 470a.

The second CGC 410a may be connected between the output node NO and the ground voltage VSS in parallel with the first CGC 310a, may generate a second current ID21a in response to the second digital code DCD2 received through the second input terminal 401 and may provide the second current ID21a to the output node NO. The second current-to-voltage converter 470a may be connected between the power supply voltage VDD and the output node NO in parallel with the first current-to-voltage converter 370a. The second current-to-voltage converter 470a may include a second resistor RC21a connected between the power supply voltage VDD and the output node NO.

The second CGC 410a may include a plurality of second transistors 411 to 41p, and a plurality of second current sources 421 to 42p. The second transistors 411 to 41p may be connected to the output node NO in parallel with respect to each other and each gate of the second transistors 411 to 41p may receive respective bit of bits CB21-CB2p of the second digital code DCD2. Each of the second current sources 421 to 42p may be connected between respective one of the second transistors 411 to 41p and the ground voltage VSS in parallel with respect to each other, and each of the second current source 421 to 42p provides the base current 1B. Each of the second transistors 411 to 41p is selectively turned-on/turned-off in response to the respective bit of bits CB21 to CB2p of the second digital code DCD2 to provide the base current IB to the output node NO. A magnitude of the second current ID21a may be determined based on a number of transistors which are turned-on from among the second transistors 411 to 41p. Each of the second transistors 411 to 41p may be implemented with an NMOS transistor. However, the one or more embodiments are not limited thereto, and the second transistors 411 to 41p may include PMOS transistors or the like.

The first current-to-voltage converter 370a and the second current-to-voltage converter 470a may convert a sum of the first current ID11a and the second current ID21a to an analog voltage VAa1 corresponding to a sum of the first digital code DCD1 and the second digital code DCD2, and output the analog voltage VAa1 at the output node NO.

The first resistance R11a and the second resistance R21a may have the same resistance of RD.

Figure 11:
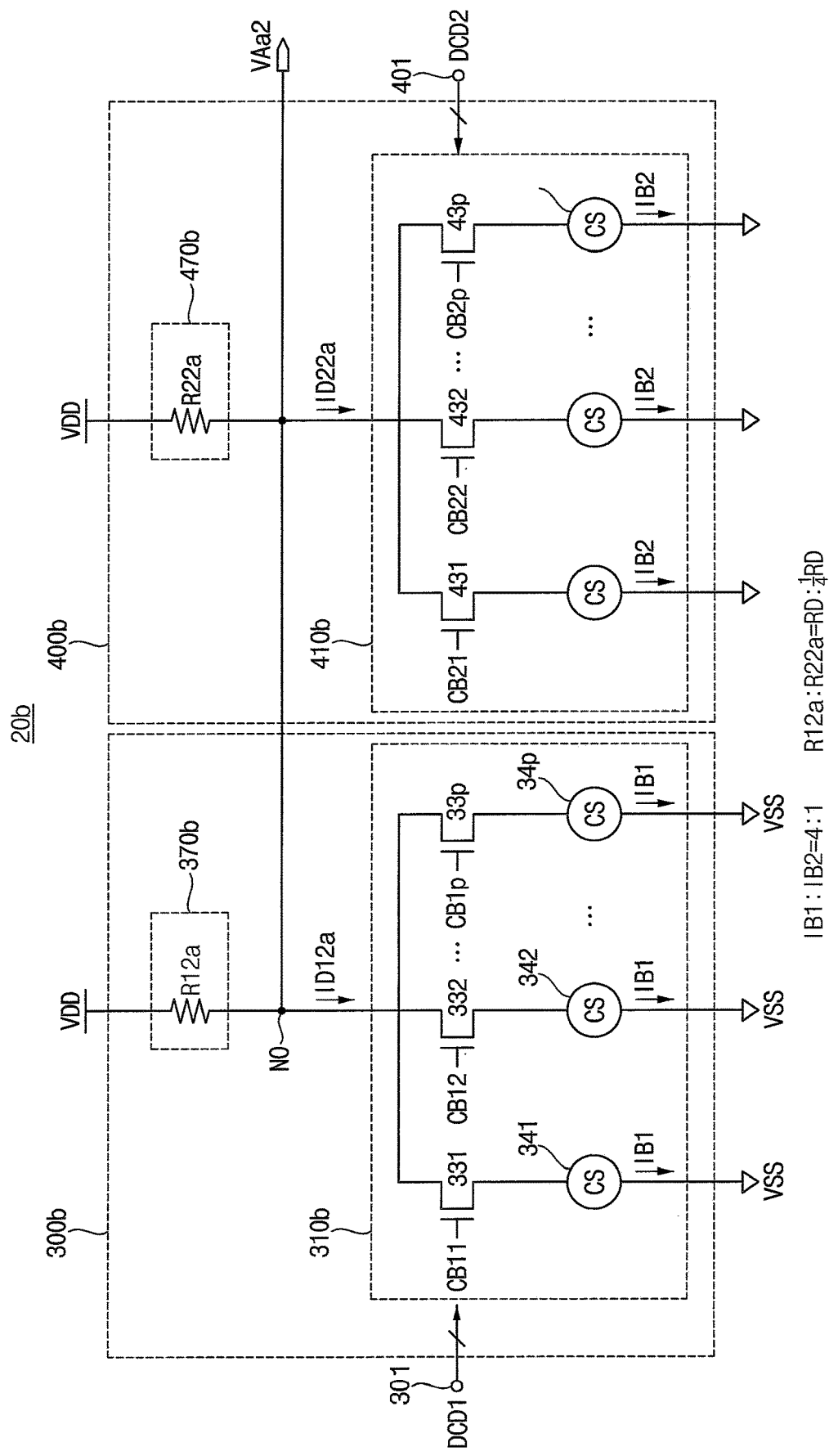
FIG. 11 is a circuit diagram illustrating an example of the digital-to-analog conversion circuit of FIG. 9 according to an embodiment.

FIG. 11 is a circuit diagram illustrating an example of the digital-to-analog conversion circuit of FIG. 9 according to an embodiment.

Referring to FIG. 11, a digital-to-analog conversion circuit 20b may include a first DAC 300b and a second DAC 400b.

The first DAC 300b may include a first CGC 310b and a first current-to-voltage converter 370b.

The first CGC 310b may be connected between the output node NO and the ground voltage VSS. The first CGC 310b may generate a first current ID11 in response to the first digital code DCD1 received through the first input terminal 301 and may provide the first current ID12a to the output node NO. The first current-to-voltage converter 370b may be connected between the power supply voltage VDD and the output node NO. The first current-to-voltage converter 370b may include a first resistor R12a connected between the power supply voltage VDD and the output node NO.

The first CGC 310b may include a plurality of first transistors 331 to 33p, and a plurality of first current sources 341 to 34p. The first transistors 331 to 33p may be connected to the output node NO in parallel with respect to each other and each gate of the first transistors 331 to 33p may receive respective bit of bits CB11 to CB1p of the first digital code DCD1. Each of the first current sources 341 to 34p may be connected between respective one of the first transistors 331 to 33p and the ground voltage VSS in parallel with respect to each other, and each of the first current source 31 to 32p provides a first base current IB1. Each of the first transistors 331 to 33p is selectively turned-on/turned-off in response to the respective bit of bits CB11 to CB1p of the first digital code DCD1 to provide the first base current IB1 to the output node NO. A magnitude of the first current ID12a may be determined based on a number of transistors which are turned-on from among the first transistors 331 to 33p. Each of the first transistors 331 to 33p may be implemented with an NMOS transistor.

The second DAC 400b may include a second CGC 410b and a second current-to-voltage converter 470b.

The second CGC 410b may be connected between the output node NO and the ground voltage VSS in parallel with the first CGC 310b. The second CGC 410b may generate a second current ID22a in response to the second digital code DCD2 received through the second input terminal 401 and may provide the second current ID22a to the output node NO. The second current-to-voltage converter 470b may be connected between the power supply voltage VDD and the output node NO in parallel with the first current-to-voltage converter 370b. The second current-to-voltage converter 470b may include a second resistor R22a connected between the power supply voltage VDD and the output node NO.

The second CGC 410b may include a plurality of second transistors 431 to 43p, and a plurality of second current sources 441 to 44p. The second transistors 431 to 43p may be connected to the output node NO in parallel with respect to each other and each gate of the second transistors 431 to 43p may receive respective bit of bits CB21 to CB2p of the second digital code DCD2. Each of the second current sources 441 to 44p may be connected between respective one of the second transistors 431 to 43p and the ground voltage VSS in parallel with respect to each other, and each of the second current source 431 to 43p provides a second base current IB2. Each of the first transistors 431 to 43p is selectively turned-on/turned-off in response to the respective bit of bits CB21 to CB2p of the second digital code DCD2 to provide the second base current IB2 to the output node NO. A magnitude of the second current ID22a may be determined based on a number of transistors which are turned-on from among the second transistors 431 to 43p. Each of the second transistors 431 to 43p may be implemented with an NMOS transistor.

The first current-to-voltage converter 370b and the second current-to-voltage converter 470b may convert a sum of the first current ID12a and the second current ID22a to an analog voltage VAa2 corresponding to weighted sum of the first digital code DCD1 and the second digital code DCD2, at the output node NO.

The first resistance R12a may have a resistance of RD and the second resistor R22a may have a resistance of RD/4. In addition, the first base current IB1 and the second base current IB2 may have a ratio of 4:1.

Figure 12:
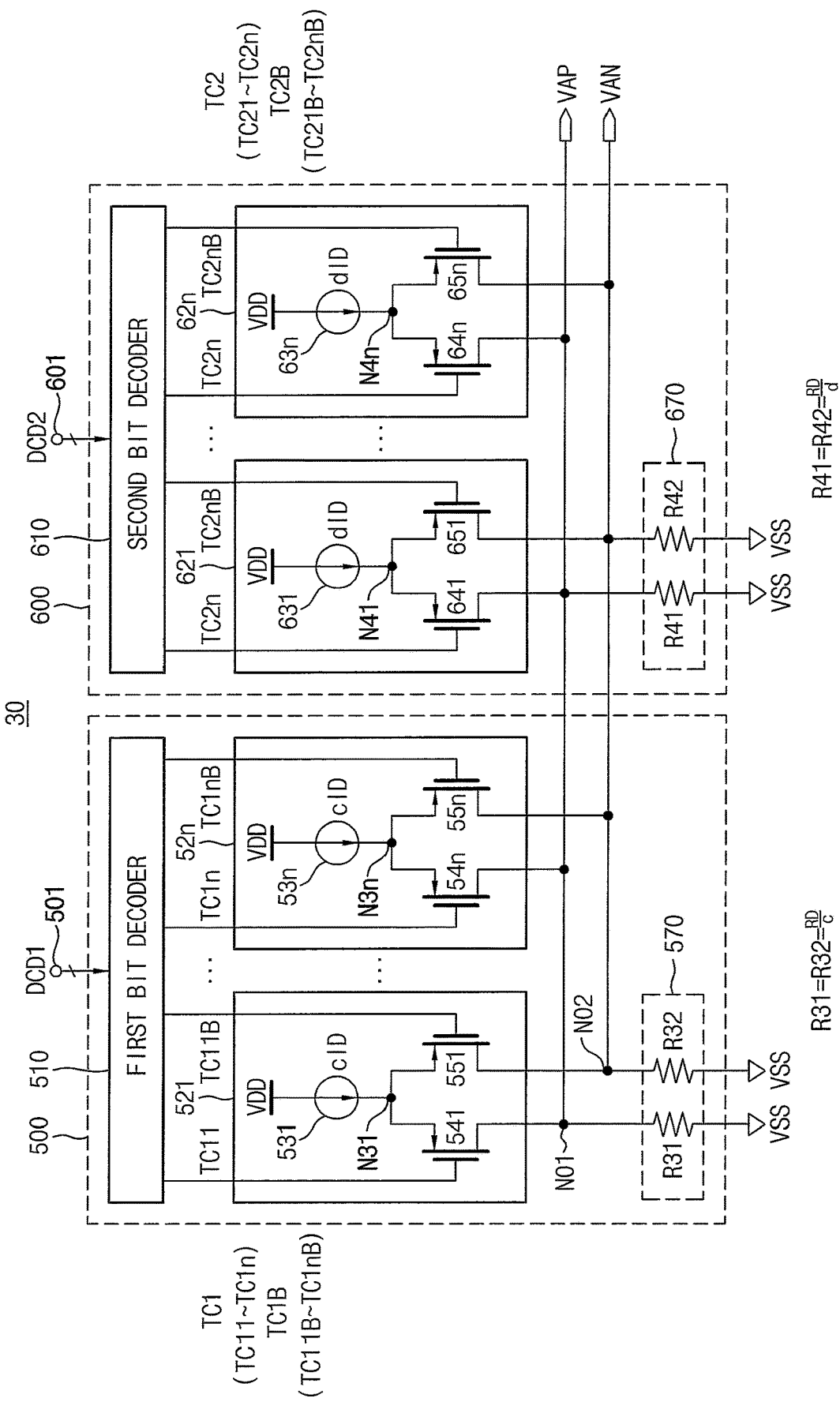
FIG. 12 is a block diagram illustrating a digital-to-analog conversion circuit according to an embodiment.

FIG. 12 is a block diagram illustrating a digital-to-analog conversion circuit according to an embodiment.

Referring to FIG. 12, a digital-to-analog conversion circuit 30 may include a first DAC 500 and a second DAC 600.

The first DAC 500 may include a first binary-to-thermometer code converter (BTC) 510, a plurality of first current cells 521 to 52n (where, n is a positive integer equal to or greater than three) and a first current-to-voltage converter 570.

The first BTC 510 may be also referred to as a first bit decoder.

The first BTC 510 may convert a first digital code DCD1 received through a first input terminal 501 to a first thermometer code TC1 and a first inverted thermometer code TC1B and may provide the first thermometer code TC1 and the first inverted thermometer code TC1B to the first current cells 521 to 52n.

The first thermometer code TC1 may include bits TC11 to TC1n and the first inverted thermometer code TC1B may include bits TC11B to TC1nB. The first thermometer code TC1 may have code values inversely proportional to code values of the first inverted thermometer code TC1B.

The first current cells 521 to 52n may be connected between a power supply voltage VDD and a first output node NO1, and may provide a first current to the first output node NO1 in response to the first thermometer code TC1. In addition, the first current cells 521 to 52n may be connected between the power supply voltage VDD and a second output node NO2, and may provide a first sub current to the second output node NO2 in response to the first inverted thermometer code TC1B. Each of the first current cells 521 to 52n may generate a first base current cID.

Each of the first current cells 521 to 52n may include respective one of current sources 531 to 53n coupled to the power supply voltage VDD, respective one of first transistors 541 to 54n coupled to the respective one of current sources 531 to 53n at respective one of first internal nodes N31 to N3n and respective one of second transistors 551 to 55n coupled to the respective one of the current sources 531 to 53n at respective one of the first internal nodes N31 to N3n in parallel with the respective one of first transistors 541 to 54n. Each of the first transistors 541 to 54n may include a PMOS transistor and each of the second transistors 551 to 55n may include a PMOS transistor. However, the one or more embodiments are not limited thereto, and the first transistors 541 to 54n and the second transistors 551 to 55n may include NMOS transistors.

Each of the first transistors 541 to 54n may have a first electrode coupled to respective one of the first internal nodes N31 to N3n, a gate configured to receive one of the bits TC11 to TC1n of the first thermometer code TC1 and a second electrode coupled to the first output node NO1.

Each of the second transistors 551 to 55n may have a first electrode coupled to respective one of the first internal nodes N31 to N3n, a gate configured to receive one of the bits TC11B to TC1nB of the first inverted thermometer code TC1B and a second electrode coupled to the second output node NO2.

Each of the first transistors 541 to 54n is selectively turned-on in response to corresponding one of the bits TC11 to TC1n of the first thermometer code TC1 to provide the first base current cID to the first output node NO1. Each of the second transistors 551 to 55n is selectively turned-on in response to corresponding one of the bits TC11B to TC1nB of the first inverted thermometer code TC1B to provide the first base current cID to the second output node NO2. Since the first thermometer code TC1 has code values inversely proportional to code values of the first inverted thermometer code TC1B, a magnitude of the first current may be inversely proportional to a magnitude of the first sub current.

The first current-to-voltage converter 570 may be connected to the first output node NO1, the second output node NO2 and the ground voltage VSS. The first current-to-voltage converter 570 may include a first resistor R31 connected between the first output node NO1 and the ground voltage VSS and a second resistor R32 connected between the second output node NO2 and the ground voltage VSS. Each of the first resistor R31 and the second resistor R32 may have a first resistance of RD/c.

The second DAC 600 may include a second BTC 610, a plurality of second current cells 621 to 62n and a second current-to-voltage converter 670.

The second BTC 610 may be also referred to as a second bit decoder.

The second BTC 610 may convert a second digital code DCD2 received through a second input terminal 601 to a second thermometer code TC2 and a second inverted thermometer code TC2B and may provide the second thermometer code TC2 and the second inverted thermometer code TC2B to the second current cells 621 to 62n.

The second thermometer code TC2 may include bits TC21 to TC2n and the second inverted thermometer code TC2B may include bits TC21B to TC2n B. The second thermometer code TC2 may have code values inversely proportional to code values of the second inverted thermometer code TC2B.

The second current cells 621 to 62n may be connected between the power supply voltage VDD and the first output node NO1, and may provide a second current to the first output node NO1 in response to the second thermometer code TC2. In addition, the second current cells 621 to 62n may be connected between the power supply voltage VDD and the second output node NO2, and may provide a second sub current to the second output node NO2 in response to the second inverted thermometer code TC2B. Each of the second current cells 621 to 62n may generate a second base current dID.

Each of the second current cells 621 to 62n may include respective one of current sources 631 to 63n coupled to the power supply voltage VDD, respective one of third transistors 641 to 64n coupled to the respective one of current sources 631 to 63n at respective one of second internal nodes N41 to N4n and respective one of fourth transistors 651 to 65n coupled to the respective one of the current sources 631 to 63n at respective one of the second internal nodes N41 to N4n in parallel with the respective one of the third transistors 641 to 64n. Each of the third transistor 641 to 64n may include a PMOS transistor and each of the fourth transistor 651 to 65n may include a PMOS transistor.

Each of the third transistors 641 to 64n may have a first electrode coupled to one of the second internal nodes N41 to N4n, a gate configured to receive one of the bits TC21 to TC2n of the second thermometer code TC2 and a second electrode coupled to the first output node NO1.

Each of the fourth transistor 651 to 65n may have a first electrode coupled to respective one of the second internal nodes N41 to N4n, a gate receiving corresponding one of the bits TC21B to TC2nB of the second inverted thermometer code TC2B and a second electrode coupled to the second output node NO2.

Each of the third transistors 641 to 64n is selectively turned-on in response to corresponding one of the bits TC21 to TC2n of the second thermometer code TC2 to provide the second base current dID to the first output node NO1. Each of the fourth transistors 651 to 65n is selectively turned-on in response to corresponding one of the bits TC21B to TC2nB of the second inverted thermometer code TC2B to provide the second base current dID to the second output node NO2. Since the second thermometer code TC2 has code values inversely proportional to code values of the second inverted thermometer code TC2B, a magnitude of the second current may be inversely proportional to a magnitude of the second sub current.

The second current-to-voltage converter 670 may be connected to the first output node NO1, the second output node NO2 and the ground voltage VSS. The second current-to-voltage converter 670 may include a third resistor R41 connected between the first output node NO1 and the ground voltage VSS and a fourth resistor R42 connected between the second output node NO2 and the ground voltage VSS. Each of the third resistor R41 and the fourth resistor R42 may have a second resistance of RD/d.

Therefore, the first resistance RD/c and the second resistance RD/d may have a ratio of 1/c:1/d.

Therefore, when the first digital code DCD1 is the same as the second digital code DCD2, a magnitude of the first current and a magnitude of the second current may have a ratio of c:d.

The first current-to-voltage converter 570 and the second current-to-voltage converter 670 may convert a sum of the first current and the second current to a first analog voltage VAP corresponding to a weighted sum of the first digital code DCD1 and the second digital code DCD2, and output the first analog voltage VAP at the first output node NO1. In addition, the first current-to-voltage converter 570 and the second current-to-voltage converter 670 may convert a sum of the first sub current and the second sub current to a second analog voltage VAN corresponding to the complementary weighted sum of the first digital code DCD1 and the second digital code DCD2, and output the second analog voltage VAN at the second output node NO2.

The first digital code DCD1 may have a portion of c/(c+d) in a maximum output range of the first analog voltage VAP and the second digital code DCD2 may have a portion of d/(c+d) in the maximum output range of the first analog voltage VAP.

In addition, the first output voltage VAP may have a fixed value irrespective of c and d in a common mode in which the first digital code DCD1 and the second digital code DCD2 have a same mean value.

In FIG. 12, each of the current sources 531 to 53$n$ may use the PMOS transistor PM1 of FIG. 6A and each of the current sources 631 to 63$n$ may use the PMOS transistor PM2 of FIG. 6B.

Figure 13:
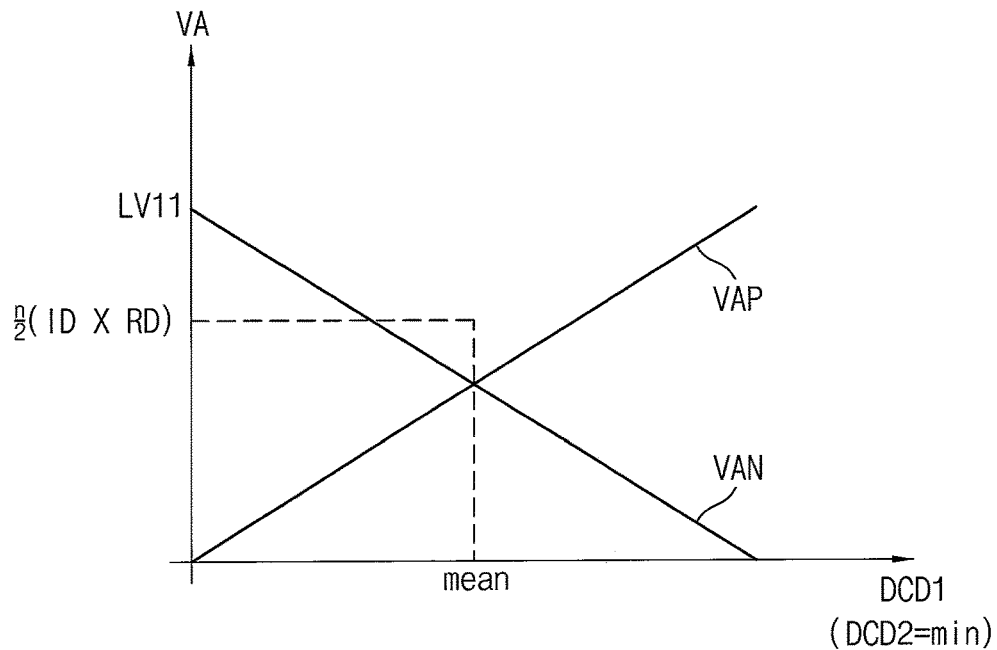
FIGS. 13, 14 and 15 are graphs illustrating a first analog voltage and a second analog voltage according to a change of the first digital code in the digital-to-analog conversion circuit of FIG. 12.
Figure 14:
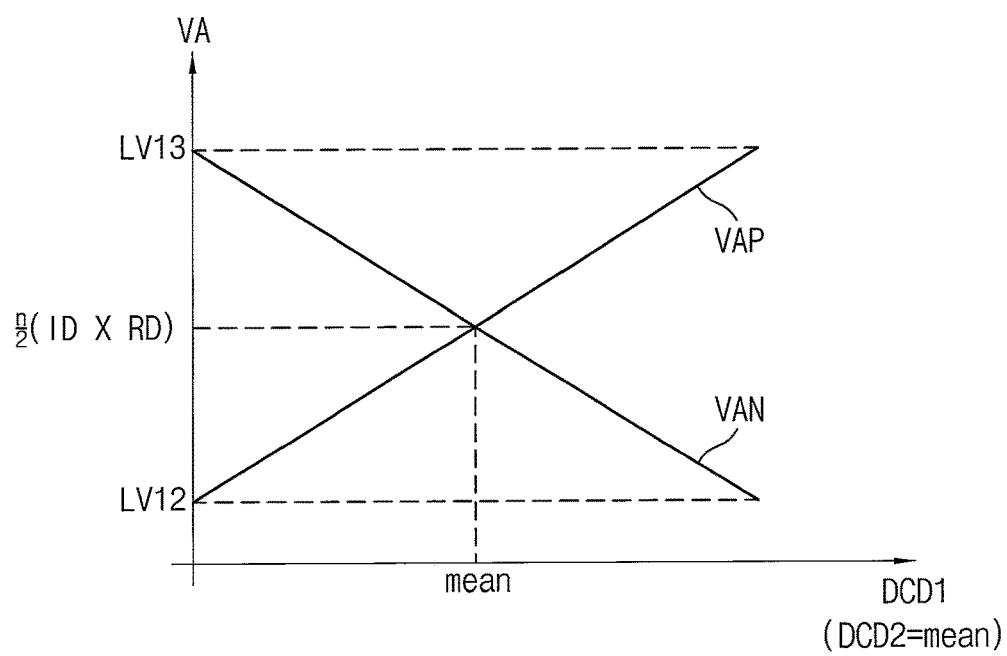
Figure 15:
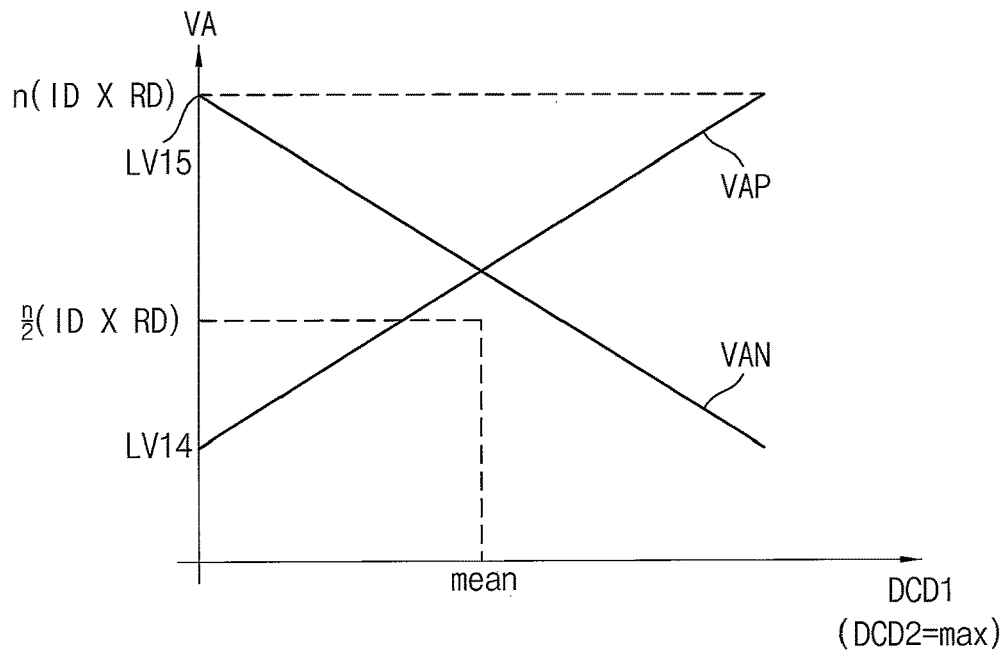

FIGS. 13, 14 and 15 are graphs illustrating the first analog voltage and the second analog voltage, respectively, according to a change of the first digital code in the digital-to-analog conversion circuit of FIG. 12.

When first digital code DCD1 is the same as the second digital code DCD2, the first current cells 521 to 52$n$ and the second current cells 621 to 62$n$ may generate the first current and the second current with a ratio of c:d as described with reference to FIG. 12. It is assumed that the first current cells 521 to 52$n$ and the second current cells 621 to 62$n$ generate the first current and the second current corresponding to n*ID/2, respectively, when the first digital code DCD1 and the second digital DCD2 have a mean value.

In FIG. 13, it is assumed that the second digital code DCD2 has a minimum value.

Referring to FIG. 13, it is assumed that the first resistor R31 and the third resistor R41 are connected in parallel with respect to the first output node NO1 and the second resistor R32 and the fourth resistor R42 are connected in parallel with respect to the second output node NO2. Here, the first analog voltage VAP gradually increases from '0' to a first level LV11 within a range of c/(c+d) and the second analog voltage VAN gradually decreases from the first level LV11 to '0' within a range of c/(c+d) according to the first digital code DCD1 changes (increases).

In FIG. 14, it is assumed that the second digital code DCD2 has a mean value.

Referring to FIG. 14, it is assumed that the first resistor R31 and the third resistor R41 are connected in parallel with respect to the first output node NO1 and the second resistor R32 and the fourth resistor R42 are connected in parallel with respect to the second output node NO2. Here, the first analog voltage VAP gradually increases from a second level LV12 to a third level LV13 within a range of c/(c+d) and the second analog voltage VAN gradually decreases from the third level LV13 to the second level LV12 within a range of c/(c+d) according to the first digital code DCD1 changes (increases).

The second level LV12 may be greater than '0' and the third level LV13 may be greater than the first level LV11.

In FIG. 15, it is assumed that the second digital code DCD2 has a maximum value.

Referring to FIG. 15, it is assumed that the first resistor R31 and the third resistor R41 are connected in parallel with respect to the first output node NO1 and the second resistor R32 and the fourth resistor R42 are connected in parallel with respect to the second output node NO2. Accordingly, the first analog voltage VAP gradually increases from a fourth level LV14 to a fifth level LV15 within a range of c/(c+d) and the second analog voltage VAN gradually decreases from the fifth level LV15 to the fourth level LV14 within a range of c/(c+d) according to the first digital code DCD1 changes (e.g., increases).

The fourth level LV14 may be greater than the second level LV12 and the fifth level LV15 may be greater than the third level LV13. The fifth level LV15 may correspond to n*(ID*RD).

Figure 16:
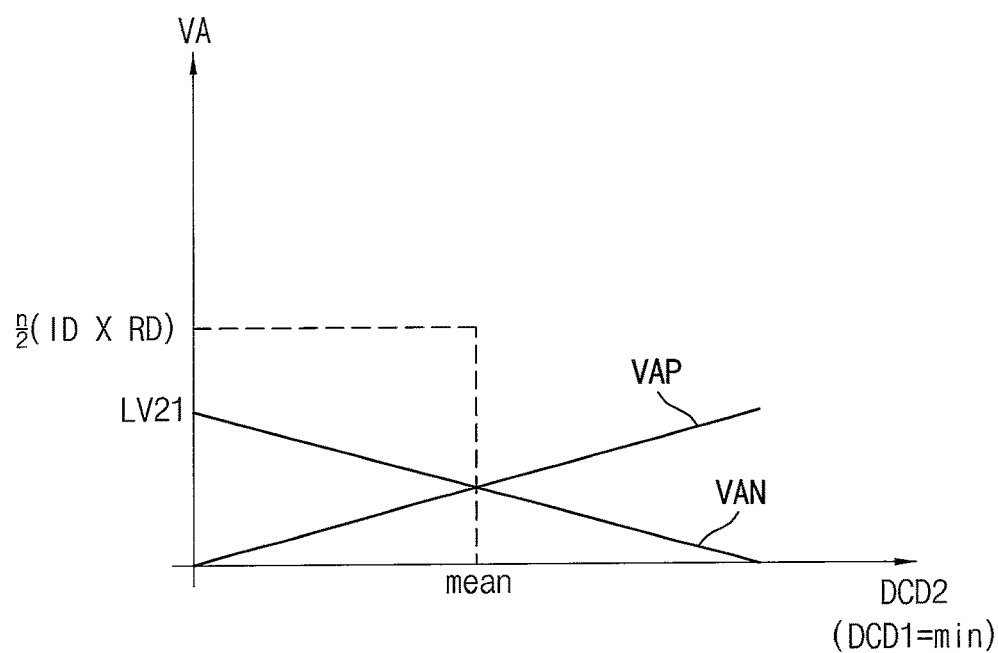
FIGS. 16, 17 and 18 are graphs illustrating the first analog voltage and the second analog voltage according to a change of the second digital code in the digital-to-analog conversion circuit of FIG. 12.
Figure 17:
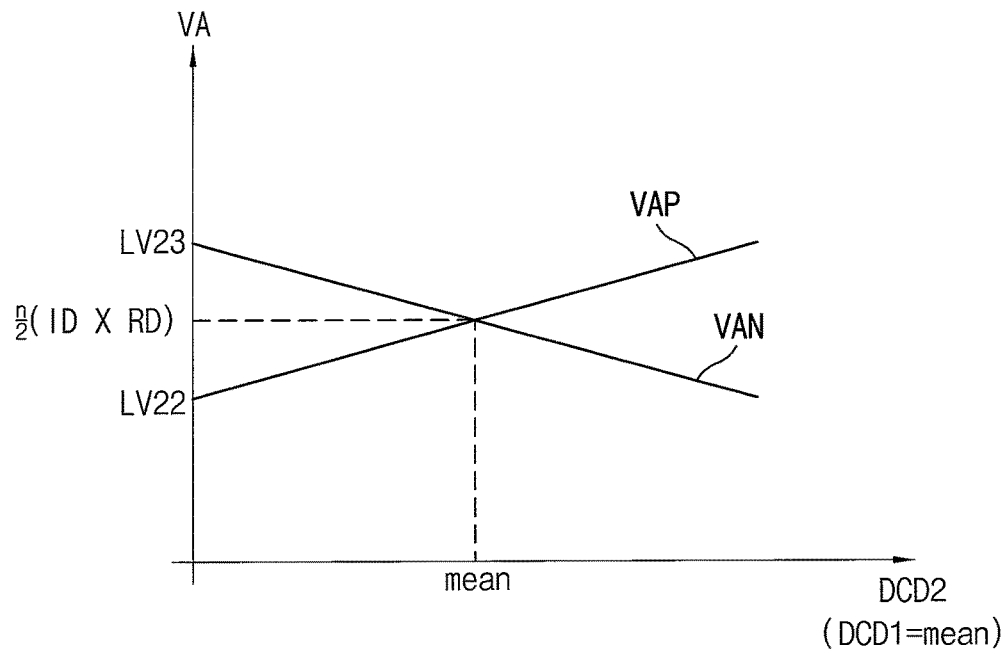
Figure 18:
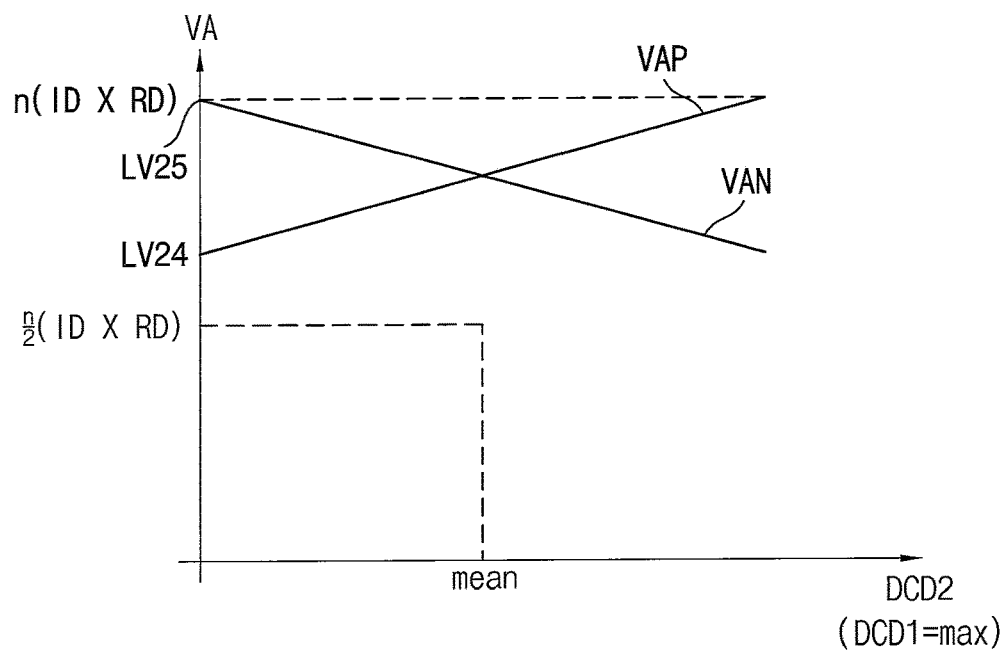

FIGS. 16, 17 and 18 are graphs illustrating the first analog voltage and the second analog voltage, respectively, according to a change of the second digital code in the digital-to-analog conversion circuit of FIG. 12.

When first digital code DCD1 is the same as the second digital code DCD2, the first current cells 521 to 52$n$ and the second current cells 621 to 62$n$ may generate the first current and the second current with a ratio of c:d as described with reference to FIG. 12. It is assumed that the first current cells 521 to 52$n$ and the second current cells 621 to 62$n$ generate the first current and the second current corresponding to n*ID/2, respectively, when the first digital code DCD1 and the second digital DCD2 have a mean value.

In FIG. 16, it is assumed that the first digital code DCD1 has a minimum value.

Referring to FIG. 16, it is assumed that the first resistor R31 and the third resistor R41 are connected in parallel with respect to the first output node NO1 and the second resistor R32 and the fourth resistor R42 are connected in parallel with respect to the second output node NO2. Here, the first analog voltage VAP gradually increases from '0' to a first level LV21 within a range of c/(c+d) and the second analog voltage VAP gradually decreases from the first level LV21 to '0' within a range of c/(c+d) according to the second digital code DCD2 changes (e.g., increases).

In FIG. 17, it is assumed that the first digital code DCD1 has a mean value.

Referring to FIG. 17, it is assumed that the first resistor R31 and the third resistor R41 are connected in parallel with respect to the first output node NO1 and the second resistor R32 and the fourth resistor R42 are connected in parallel with respect to the second output node NO2. Here, the first analog voltage VAP gradually increases from a second level LV22 to a third level LV23 within a range of c/(c+d) and the second analog voltage VAN gradually decreases from the third level LV23 to the second level LV22 within a range of c/(c+d) according to the second digital code DCD2 changes (e.g., increases).

The second level LV22 may be greater than '0' and the third level LV23 may be greater than the first level LV21.

In FIG. 18, it is assumed that the first digital code DCD1 has a maximum value.

Referring to FIG. 18, the first resistor R31 and the third resistor R41 are connected in parallel with respect to the first output node NO1 and the second resistor R32 and the fourth resistor R42 are connected in parallel with respect to the second output node NO2. Here, the first analog voltage VAP gradually increases from a fourth level LV24 to a fifth level LV25 within a range of c/(c+d) and the second analog voltage VAN gradually decreases from the fifth level LV25 to the fourth level LV24 within a range of c/(c+d) according to the second digital code DCD2 changes (e.g., increases).

The fourth level LV24 may be greater than the second level LV22 and the fifth level LV25 may be greater than the third level LV23. The fifth level LV25 may correspond to n*(ID*RD).

In FIGS. 13 through 18, n/2*(ID*RD) represents a common mode voltage when the first digital code DCD1 and the second digital DCD2 have the mean value.

FIG. 19 illustrates an example of the first digital code, the first thermometer code and the first inverted thermometer code in the digital-to-analog conversion circuit of FIG. 12.

Referring to FIG. 19, as a bit value of the first digital code DCD1 increases by one, a number of bits having a first logic level (e.g., a high level indicated by "1") in the first thermometer code TC1 increases by one and a number of bits having a first logic level (e.g., a high level) in the first inverted thermometer code TC1B decreases by one. For example, as the first digital code DCD1 changes from "000" to "001" (i.e., an increase by 1), the first thermometer code TC1 increases by 1 from "0000000" to "0000001", and the first inverted thermometer code TC1B decreases by 1 from "1111111" to "1111110."

Figure 20:
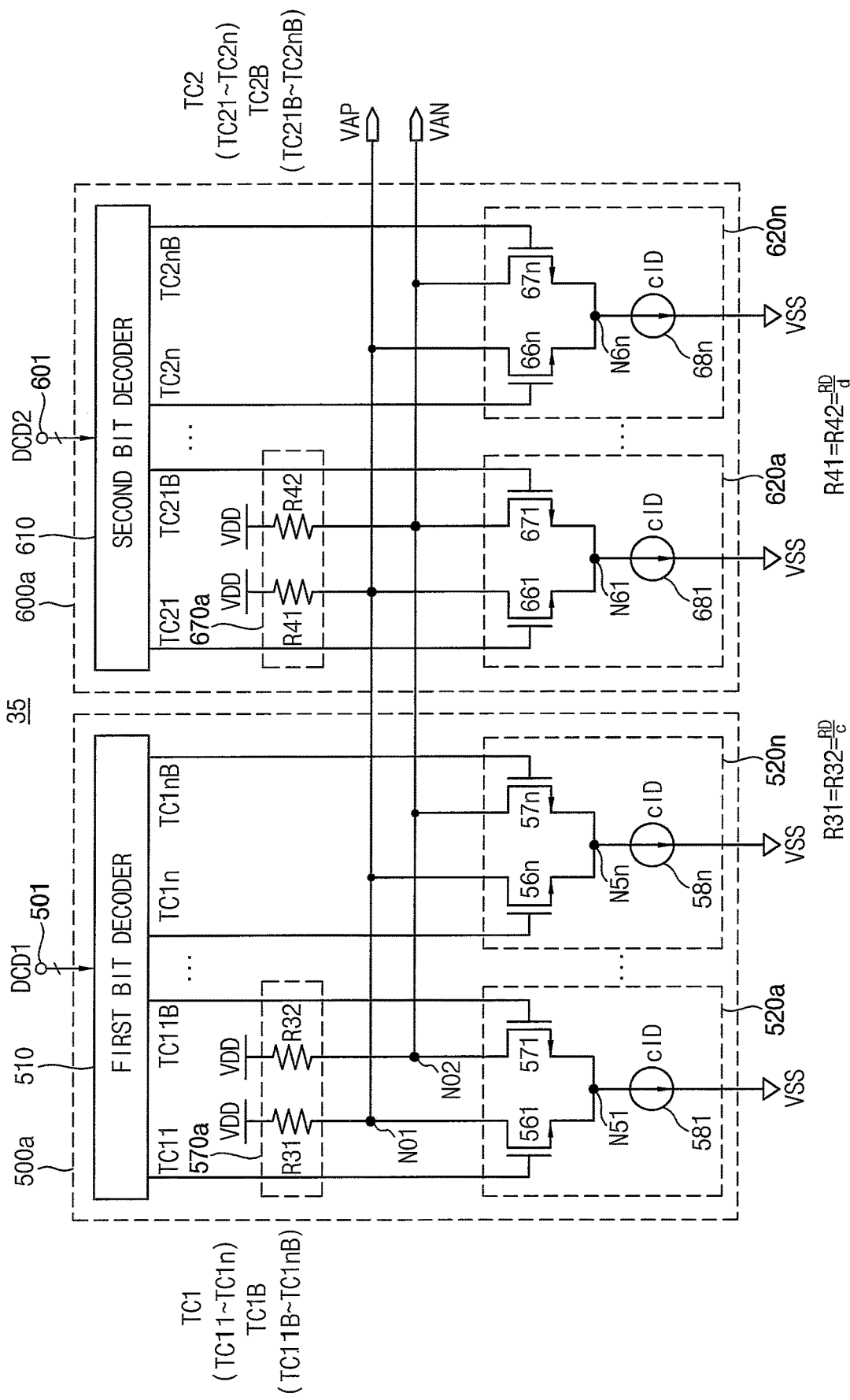
FIG. 20 is a block diagram illustrating a digital-to-analog conversion circuit according to an embodiment.

FIG. 20 is a block diagram illustrating a digital-to-analog conversion circuit according to an embodiment.

Referring to FIG. 20, a digital-to-analog conversion circuit 35 may include a first DAC 500a and a second DAC 600a.

The first DAC 500a may include a first BTC 510, a plurality of first current cells 520a to 520n and a first current-to-voltage converter 570a.

The first BTC 510 may convert a first digital code DCD1 received through a first input terminal 501 to a first thermometer code TC1 and a first inverted thermometer code TC1B and may provide the first thermometer code TC1 and the first inverted thermometer code TC1B to the first current cells 520a to 520n.

The first current cells 520a to 520n may be connected between the first output node NO1 and first voltage (the ground voltage VSS), and may provide a first current to the first output node NO1 in response to the first thermometer code TC1. In addition, the first current cells 520a to 520n may be connected between the second node NO2 and the ground voltage VSS, and may provide a first sub current to the second output node NO2 in response to the first inverted thermometer code TC1B. Each of the first current cells 520a to 520n may generate a first base current cID.

Each of the first current cells 520a to 520n may include respective one of current sources 581 to 58n coupled to the ground voltage VSS, respective one of first transistors 561 to 56n coupled to the first output node NO1 and to the respective one of current sources 581 to 58n at respective one of first internal nodes N51 to N5n and respective one of second transistors 571 to 57n coupled to the second output node NO2 and to the respective one of current sources 581 to 58n at respective one of the first internal nodes N51 to N5n in parallel with the respective one of first transistors 561 to 56n. Each of the first transistor 561 to 56n may include an NMOS transistor and each of the second transistor 571 to 57n may include an NMOS transistor. However, the first transistors 561 to 56n and the second transistors 571 to 57n are not limited thereto, and may include other types of transistors such as PMOS transistors or the like.

Each of the first transistor 561 to 56n may have a first electrode coupled to the first output node NO1, a second electrode coupled to respective one of the first internal nodes N51 to N5n, and a gate receiving corresponding one of the bits TC11 to TC1n of the first thermometer code TC1.

Each of the second transistor 571 to 57n may have a first electrode coupled to the second output node NO2, a second electrode coupled to respective one of the first internal nodes N51 to N5n, and a gate for receiving one of the bits TC11B to TC1nB of the first inverted thermometer code TC1B.

The first current-to-voltage converter 570a may be connected the power supply voltage VDD, the first output node NO1 and the second output node NO2. The first current-to-voltage converter 570a may include a first resistor RC31 connected between the power supply voltage VDD and the first output node NO1 and a second resistor RC32 connected between the power supply voltage VDD and the second output node NO2. Each of the first resistor R31 and the second resistor R32 may have a first resistance of RD/c.

The second DAC 600a may include a second BTC 610, a plurality of second current cells 620a to 620n and a second current-to-voltage converter 670a.

The second BTC 610 may convert a second digital code DCD2 received through a second input terminal 601 to a second thermometer code TC2 and a second inverted thermometer code TC2B and may provide the second thermometer code TC2 and the second inverted thermometer code TC2B to the second current cells 620a to 620n.

The second current cells 620a to 620n may be connected between the first output node NO1 and the first voltage (the ground voltage VSS), and may provide a second current to the first output node NO1 in response to the second thermometer code TC2. In addition, the second current cells 620a to 620n may be connected between the second node NO2 and the ground voltage VSS, and may provide a second sub current to the second output node NO2 in response to the second inverted thermometer code TC2B. Each of the second current cells 620a to 620n may generate a second base current dID.

Each of the second current cells 620a to 620n may include respective one of current sources 681 to 68n coupled to the ground voltage VSS, respective one of third transistors 661 to 66n coupled to the first output node NO1 and to the respective one of current sources 681 to 68n at respective one of second internal nodes N61 to N56 and respective one of fourth transistors 671 to 67n coupled to the second output node NO2 and to respective one of current sources 681 to 68n at respective one of the second internal nodes N61 to N6n in parallel with the respective one of third transistors 661 to 66n. Each of the third transistor 661 to 66n may include an NMOS transistor and each of the fourth transistor 671 to 67n may include an NMOS transistor.

Each of the third transistor 661 to 66n may have a first electrode coupled to the first output node NO1, a second electrode coupled to respective one of the second internal nodes N61 to N6n, and a gate receiving corresponding one of the bits TC21 to TC2n of the second thermometer code TC2.

Each of the fourth transistor 671 to 67n may have a first electrode coupled to the second output node NO2, a second electrode coupled to respective one of the second internal nodes N61 to N6n, and a gate for receiving corresponding one of the bits TC21B to TC2nB of the second inverted thermometer code TC2B.

The second current-to-voltage converter 670a may be connected the power supply voltage VDD, the first output node NO1 and the second output node NO2. The second current-to-voltage converter 670a may include a third resistor R41 connected between the power supply voltage VDD and the first output node NO1 and a fourth resistor R42 connected between the power supply voltage VDD and the second output node NO2. Each of the third resistor R41 and the fourth resistor R42 may have a first resistance of RD/d.

The first current-to-voltage converter 570a and the second current-to-voltage converter 670a may convert a sum of the first current and the second current to a first analog voltage VAP corresponding to a weighted sum of the first digital code DCD1 and the second digital code DCD2, and output the first analog voltage VAP at the first output node NO1. In addition, the first current-to-voltage converter 570a and the second current-to-voltage converter 670a may convert a sum of the first sub current and the second sub current to a second analog voltage VAN corresponding to the complementary weighted sum of the first digital code DCD1 and the second digital code DCD2, and output the second analog voltage VAN at the second output node NO2.

Figure 21:
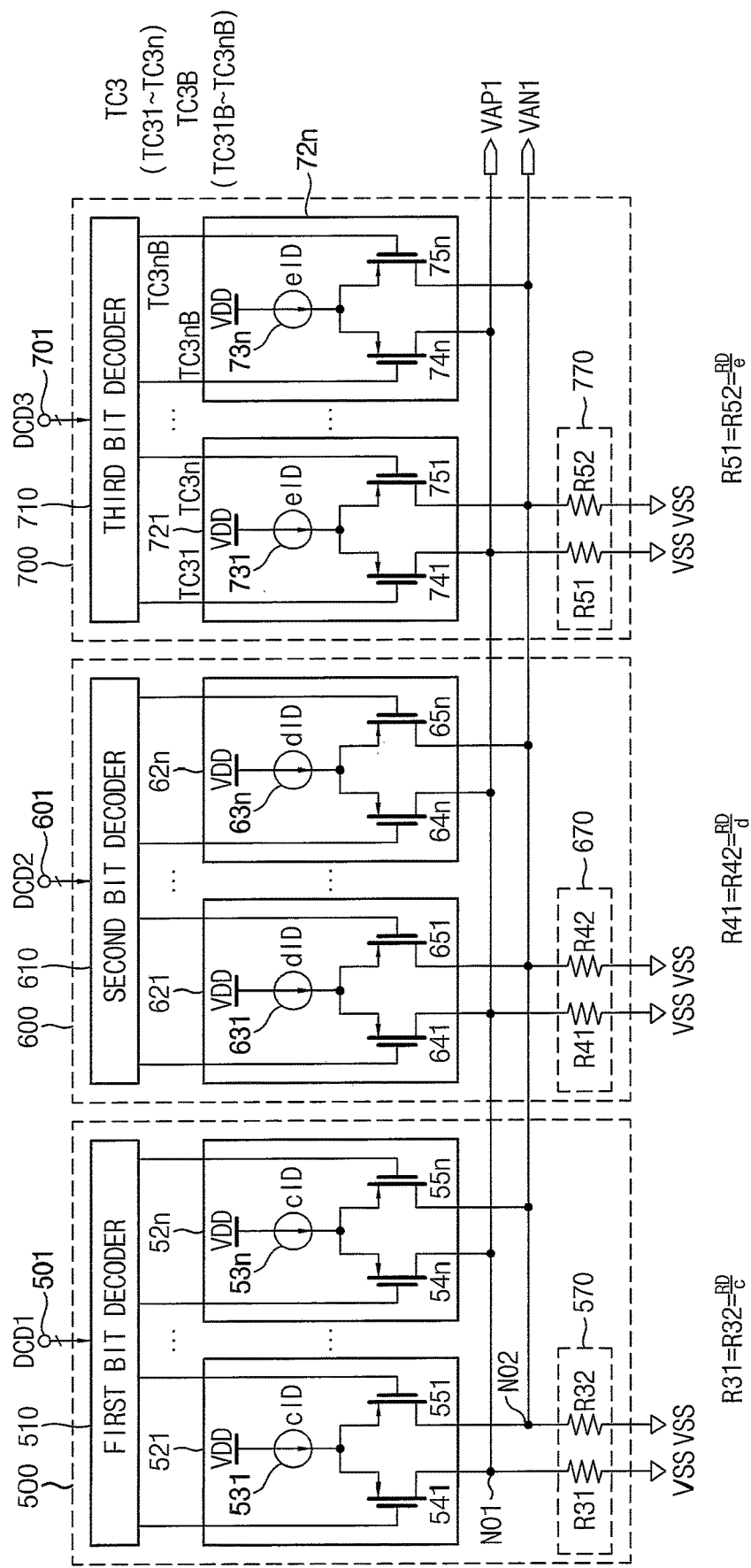
FIG. 21 is a block diagram illustrating a digital-to-analog conversion circuit according to an embodiment.

FIG. 21 is a block diagram illustrating a digital-to-analog conversion circuit according to an embodiment.

Referring to FIG. 21, a digital-to-analog conversion circuit 40 may include a first DAC 500, a second DAC 600 and a third DAC 700.

The digital-to-analog conversion circuit 40 differs from the digital-to-analog conversion circuit 30 of FIG. 12 in that the digital-to-analog conversion circuit 40 further includes the third DAC 700.

The third DAC 700 may include a third BTC 710, a plurality of third current cells 721 to 72n and a third current-to-voltage converter 770.

The third BTC 710 may be also referred to as a third bit decoder.

The third BTC 710 may convert a third digital code DCD3 received through a third input terminal 701 to a third thermometer code TC3 and a third inverted thermometer code TC3B and may provide the third thermometer code TC3 and the third inverted thermometer code TC3B to the third current cells 721 to 72n.

The third thermometer code TC3 may include bits TC31 to TC3n and the third inverted thermometer code TC3B may include bits TC31B to TC3n B. The third thermometer code TC3 may have code values inversely proportional to code values of the third inverted thermometer code TC3B.

The third current cells 721 to 72n may be connected between the power supply voltage VDD and the first output node NO1, and may provide a third current to the first output node NO1 in response to the third thermometer code TC3. In addition, the third current cells 721 to 72n may be connected between the power supply voltage VDD and the second output node NO2, and may provide a third sub current to the second output node NO2 in response to the third inverted thermometer code TC3B.

Each of the third current cells 721 to 72n may generate a third base current eID. Here, e is a positive real number.

Each of the third current cells 721 to 72n may include respective one of current sources 731 to 73n coupled to the power supply voltage VDD, respective one of fifth transistors 741 to 74n coupled to the respective one of current sources 731 to 73n at respective one of third internal nodes and respective one of sixth transistors 751 to 75n coupled to the respective one of current sources 731 to 73n at respective one of the third internal nodes in parallel with the respective one of the fifth transistors 741 to 74n. Each of the fifth transistor 741 to 74n may include a PMOS transistor and each of the sixth transistor 751 to 75n may include a PMOS transistor.

Each of the fifth transistor 741 to 74n may have a first electrode coupled to respective one of the third internal nodes, a gate for receiving one of the bits TC31 to TC3n of the third thermometer code TC3 and a second electrode coupled to the first output node NO1.

Each of the sixth transistor 751 to 75n may have a first electrode coupled to respective one of the third internal nodes, a gate for receiving one of the bits TC31B to TC3nB of the third inverted thermometer code TC3B and a second electrode coupled to the second output node NO2.

Each of the fifth transistors 741 to 74n is selectively turned-on in response to corresponding one of the bits TC31 to TC3n of the third thermometer code TC3 to provide the third base current eID to the first output node NO1. Each of the sixth transistors 751 to 75n is selectively turned-on in response to corresponding one of the bits TC31B to TC3nB of the third inverted thermometer code TC3B to provide the third base current eID to the second output node NO2. Since the third thermometer code TC3 has code values inversely proportional to code values of the third inverted thermometer code TC3B, a magnitude of the third current may be inversely proportional to a magnitude of the third sub current.

The third current-to-voltage converter 770 may be connected to the first output node NO1, the second output node NO2 and the ground voltage VSS. The third current-to-voltage converter 770 may include a fifth resistor R51 connected between the first output node NO1 and the ground voltage VSS and a sixth resistor R52 connected between the second output node NO2 and the ground voltage VSS. Each of the fifth resistor R51 and the sixth resistor R52 may have a third resistance of RD/e.

The first current-to-voltage converter 570, the second current-to-voltage converter 670 and the third current-to-voltage converter 770 may convert a sum of the first current, the second current and the third current to a corresponding voltage and may output a first analog voltage VAP1 corresponding to a weighted operation of the first digital code DCD1, the second digital code DCD2 and the third digital code DCD3, at the first output node NO1. In addition, the first current-to-voltage converter 570, the second current-to-voltage converter 670 and the third current-to-voltage converter 770 may convert a sum of the first current, the second current and the third current to a second analog voltage VAN1 corresponding to the complementary weighted operation of the first digital code DCD1, the second digital code DCD2 and the third digital code DCD3, at the second output node NO2.

Figure 22:
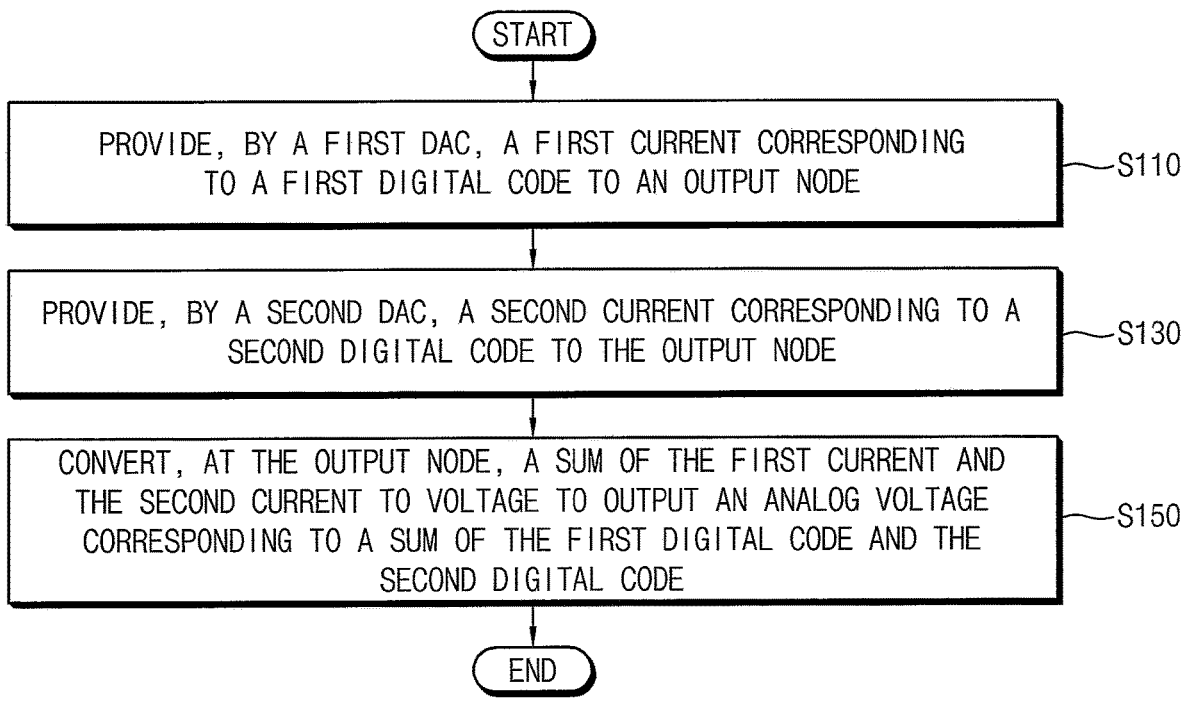
FIG. 22 is a flowchart illustrating a method of operating a digital-to-analog conversion circuit according to an embodiment.

FIG. 22 is a flowchart illustrating a method of operating a digital-to-analog conversion circuit according to an embodiment.

Referring to FIGS. 1 through 22, first DACs 100 and/or 300 may provide a first voltage corresponding to a first digital code DCD1 to an output node NO and/or NO1, in response to the first digital code DCD1 (operation S110).

The second DACs 200 and/or 400 may provide a second voltage corresponding to a second digital code DCD2 to an output node NO and/or NO1, in response to the second digital code DCD2 (operation S130).

A first current-to voltage converter 170 and/or 370 and a second current-to voltage converter 270 and/or 470 connected in parallel to the output node NO and/or NO1, converts a sum of the first current and the second current and provides, at the output node NO and/or NO1, an analog voltage VA and/or VAP corresponding to a sum (or, weighted sum) of the first digital code DCD1 and the second digital code DCD2 (operation S150).

Figure 23:
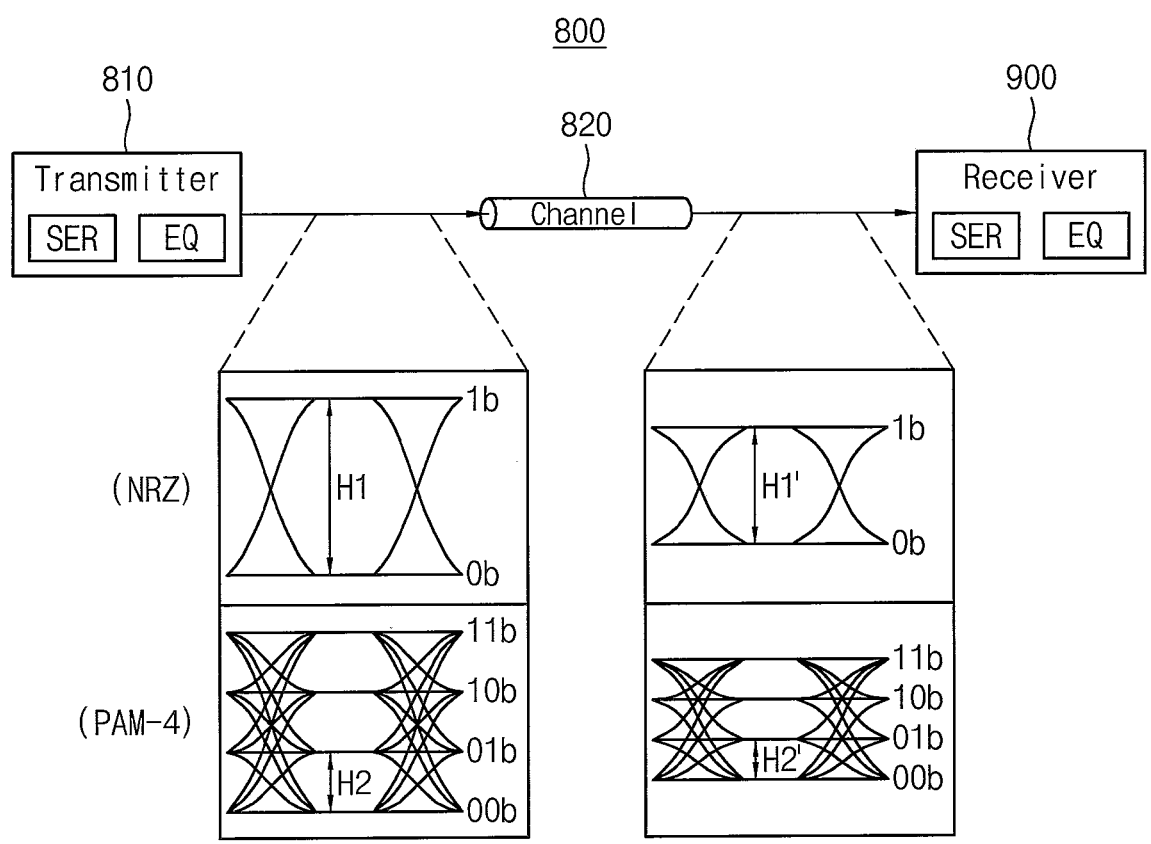
FIG. 23 is a block diagram illustrating an example of a transceiver according to an embodiment.

FIG. 23 is a block diagram illustrating an example of a transceiver according to an embodiment.

Referring to FIG. 23, a transceiver 800 may include a transmitter 810 and a receiver 900 which communicate with each other through a channel 820.

The transmitter 810 may include a serializer SER which converts parallel data to serial data, and the receiver 900 may include a deserializer DES which converts the serial data transmitted through the channel 820 from the transmitter 810 to the parallel data. The transceiver 800 including the serializer SER and the deserializer DES may be referred to as a "data transmitting/receiving circuit", a "serializer/deserializer (SERDES) circuit", a "high-speed data transmission system", etc.

The transmitter 810 may transmit a signal corresponding to data to the receiver 900 through the channel 820. The transmitter 810 may further include an equalizer EQ for compensating for a channel loss in addition to the serializer SER. For example, a voltage level of a signal which is equalized or adjusted by the equalizer EQ of the transmitter 810 may be checked by probing a path connecting an output terminal of the transmitter 810 and an input terminal of the channel 820.

In the one or more embodiments, the transmitter 810 may transmit a signal in anon-return-to-zero (NRZ) signaling scheme or a four-level pulse amplitude modulation (PAM-4) signaling scheme.

In the NRZ signaling scheme, the transmitter 810 may transmit a signal having voltage levels corresponding to first and second logical values (e.g., 0b and 1b) of data. In the PAM-4 signaling scheme, the transmitter 810 may transmit a signal having voltage levels corresponding to first to fourth logical values (e.g., 00b, 01b, 10b, and 11b) of data. At the same data rate, a bandwidth of the transmitter 810 using the PAM-4 signaling scheme may increase by two-fold compared to the NRZ signaling scheme. However, a difference between voltage levels associated with the PAM-4 signaling scheme may decrease by three-fold compared to the NRZ signaling scheme.

The signaling scheme of the transmitter 810 is not limited to the above examples. For example, when a signaling scheme such as PAM-8 or PAM-16 is applied to the transmitter 810, voltage levels of a signal output from the transmitter 810 may correspond to four or more logical values. Looking at a signal output from the output terminal of the transmitter 810 of FIG. 23, overlapped waveforms in which bits of data are transmitted in series may be similar to an eye shape. In general, a height of an eye opening may be measured to evaluate the transceiving (transmitting and receiving) performance of the transceiver 810.

The channel 820 may be an electrical path that connects the transmitter 810 and the receiver 900 for communication between the transmitter 810 and the receiver 900. For example, the channel 820 may include a trace of a printed circuit board (PCB) or a coaxial cable. The channel 820 may transmit high-frequency contents of high-speed random data transmitted through the channel 820. However, in general, the channel 820 may be degraded due to a skin effect, a dielectric loss, etc.

That is, a channel loss may occur in the signal transmitted through the channel 820. Also, the channel 820 may cause impedance discontinuity (mismatch) due to connectors between boards and cables, and any other physical interfaces. The impedance discontinuity of the channel 820 may appear as a notch at a frequency response of the channel 820. Also, each of bits of data passing through the channel 820 may disturb a next bit due to the channel loss or a limited bandwidth, and a phenomenon in which a bit error rate increases due to overlapping of neighboring symbols, that is, an inter symbol interference (ISI) may occur.

Eye diagrams of a signal which is output from the output terminal of the transmitter 810 and does not pass through the channel 820 are illustrated in FIG. 23. In FIG. 23, a horizontal axis of the eye diagrams may represent time, and a vertical axis of the eye diagrams may represent a voltage level.

A height of an eye opening in the NRZ signaling scheme may be H1, and a height of an eye opening in the PAM-4 signaling scheme may be H2 (approximately one third of H1). Here, a unit of the height of the eye opening may be a voltage level. Eye diagrams of a signal which is output from the output terminal of the transmitter 810 and passes through the channel 820 (e.g., input to an input terminal of the receiver 900) are further illustrated in FIG. 23. The height of the eye opening in the received NRZ signaling scheme may be H1', and the height of the eye opening in the received PAM-4 signaling scheme may be H2'. The height of the eye opening may decrease due to the channel loss. For example, H1 may decrease to H1', and H2 may decrease to H2'.

The receiver 900 may receive a signal of data through the channel 820. The receiver 900 may further include an equalizer EQ having an opposite characteristic to a characteristic of the channel 820 for compensating for the channel loss in addition to the deserializer DES. For example, the channel 820 may have a characteristic of a frequency response like a low pass filter, and the equalizer EQ of the receiver 900 may have a characteristic of a frequency response like a high pass filter.

Eye diagrams at the output terminal of the transmitter 810 and eye diagrams at an input terminal of the receiver 900 are illustrated in FIG. 23, respectively.

As described above, how much the transmitter 810 compensates for the channel loss may be checked by probing an eye diagram at the output terminal of the transmitter 810. In contrast, even though the receiver 900 compensates for the channel loss of the received signal, how much the receiver 900 compensates for the channel loss cannot be checked through the probing. Accordingly, there is a need for a circuit which checks how much the receiver 900 compensates for the channel loss and may be implemented within the receiver 900, that is, an eye opening monitoring circuit.

Figure 24:
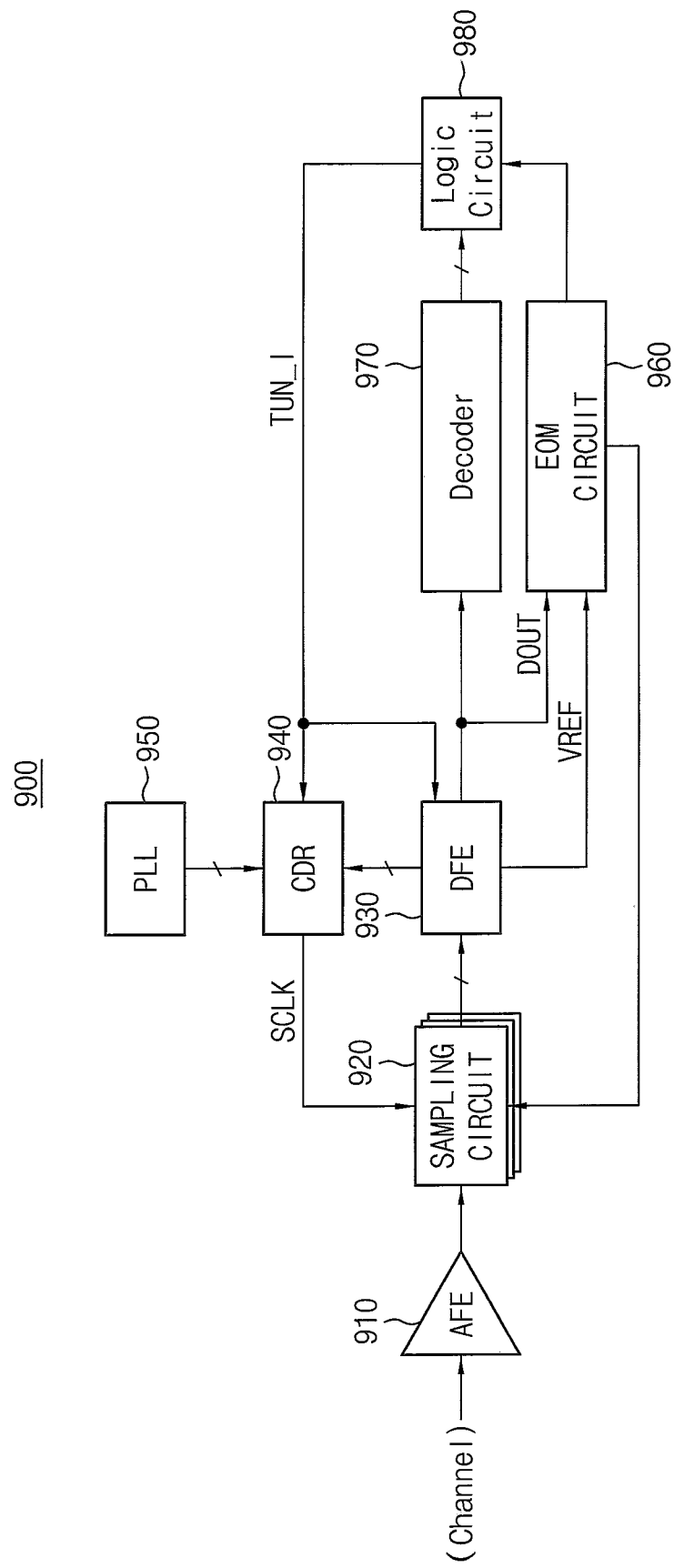
FIG. 24 is a block diagram illustrating a receiver of FIG. 23 according to an embodiment.

FIG. 24 is a block diagram illustrating a receiver in FIG. 23.

FIG. 24 will be described with reference to FIG. 23.

A receiver 900 may include an analog front end (AFE) 910, a sampling circuit 920, an equalizer (DFE) 930, a clock and data recovery (CDR) circuit 940, a phase locked loop (PLL) 950, an eye opening monitoring circuit (EOM circuit) 960, a decoder 970, and a logic circuit 980.

The analog front end 910 may receive a signal transmitted through the channel 820 and may transmit or provide the received signal to the sampling circuit 920. For example, the analog front end 910 may be an analog signal processing circuit including at least one amplifier, which amplifies the received signal, such as a low noise amplifier (LNA) or a variable gain amplifier (VGA).

The sampling circuit 920 may receive the signal processed by the analog front end 910. The sampling circuit 920 may sample voltage levels of a signal based on a sampling clock SCLK.

For example, in the NRZ signaling scheme, the sampling circuit 920 may sample voltage levels corresponding to a first logical value (e.g., 0b) of data and voltage levels corresponding to a second logical value (e.g., 1b) of the data.

In the PAM-4 signaling scheme, the sampling circuit 920 may sample voltage levels corresponding to a first logical value (e.g., 00b) of data, voltage levels corresponding to a second logical value (e.g., 01b) of the data, voltage levels corresponding to a third logical value (e.g., 10b) of the data, and voltage levels corresponding to a fourth logical value (e.g., 11b) of the data.

The sampling circuit 920 may provide voltage levels sampled in the form of analog signals or in the form of digital signals to the equalizer 930. For example, the sampling circuit 920 may include at least one analog-to-digital converter (ADC) which converts a signal received from the analog front end 910 to a signal of a digital form based on the sampling clock SCLK. As illustrated in FIG. 24, the number of the sampling circuit 920 may be at least one.

The equalizer 930 may receive voltage levels of a signal corresponding to logical values of data. The equalizer 930 may adjust the received voltage levels for compensating for the channel loss. That is, the equalizer 930 may increase a height of an eye opening by removing or suppressing noise, jitter, ISI, etc. due to the channel 820 and compensating for the channel loss. For example, the equalizer 930 may include a decision-feedback equalizer (DFE) which is a non-linear equalizer and a feed-forward equalizer (FFE) which is a linear equalizer.

For example, it is assumed that a unit interval UI (i.e., a 1-bit interval) of the signal transmitted through the channel 820 is "T". At an impulse response of the channel 820, the above-described ISI of the channel 820 may cause postcursors at times corresponding to an integer multiple of "T" such as T, 2T, 3T, and the like. The DFE of the equalizer 130 may multiply a voltage level of the received signal and magnitudes (e.g., DFE coefficients) of the postcursors together and may add the multiplication results. Next, the equalizer 930 may suppress the ISI due to the postcursors by subtracting the addition result from a voltage level of a newly received signal. The DFE of the equalizer 930 may include as many taps as the number of DFE coefficients. As such, the DFE may be referred to as an "n-tap DFE" (n being a natural number). For example, the DFE of the equalizer 930 may include a slicer or a flip-flop for decision, a multiplier, and an adder.

The clock and data recovery circuit 940 may receive voltage levels of output data DOUT from the equalizer 930. The voltage levels of the output data DOUT may be equalized or adjusted based on the above-described operation of the equalizer 930. The clock and data recovery circuit 940 may receive clocks having multiple phases provided from the phase locked loop 950. The clock and data recovery circuit 940 may generate, adjust, and/or recover the sampling clock SCLK based on the voltage levels of the output data DOUT and the clocks having the multiple phases. The sampling clock SCLK may also be referred to as a "recovery clock". A signal provided from the analog front end 910 may be sampled by the sampler 920 at a rising edge or a falling edge of the sampling clock SCLK.

The clock and data recovery circuit 940 may adjust a sampling point of the sampling circuit 920 by adjusting a phase of the sampling clock SCLK. For example, the clock and data recovery circuit 940 may include a phase interpolator which mixes the clocks of the multiple phases provided from the phase locked loop 950 based on the voltage levels equalized or adjusted by the equalizer 930.

The phase locked loop 950 may generate the clocks having the multiple phases and may provide the clocks to the clock and data recovery circuit 940. For example, the phase locked loop 950 may include a phase detector to compare a reference clock with one of the generated clocks, a loop filter, a voltage controlled oscillator or a digitally controlled oscillator, and the like. Here, the reference clock may be received from the outside of the receiver 900 or may be generated within the receiver 900.

The eye opening monitoring circuit 960 may perform an operation of measuring a height of an eye opening after the equalizer 930 and the clock and data recovery circuit 940 are locked. For example, coefficients (DFE coefficients) of the equalizer 930 after the locking may be fixed, and a phase change of the sampling clock SCLK output from the clock and data recovery circuit 940 after the locking may be within a predetermined range. The height of the eye opening measured by the eye opening monitoring circuit 960 may be used to determine how much the equalizer 930 and the clock and data recovery circuit 940 remove noise, jitter, ISI, etc. and compensate for the channel loss.

The eye opening monitoring circuit 960 may receive voltage levels of the output data DOUT from the equalizer 930. Also, the eye opening monitoring circuit 960 may receive a reference voltage level VREF from the equalizer 930. The reference voltage level may be a center level or an average level of voltage levels corresponding to any one of logical values of the output data DOUT.

In the NRZ signaling scheme, each of a center level of voltage levels corresponding to a first logical value 0b of the output data DOUT and a center level of voltage levels corresponding to a second logical value 1b of the output data DOUT may be the reference voltage level. For example, the reference voltage level which is the center level of the voltage levels corresponding to the second logical value 1b may correspond to the magnitude of a main cursor of an impulse response of the channel 820 or to the reference voltage level of the equalizer 930. The eye opening monitoring circuit 960 may calculate a reference voltage level of the voltage levels corresponding to the first logical value 0b by using the reference voltage level of the voltage levels which correspond to the second logical value 1b and are provided from the equalizer 930.

In the PAM-4 signaling scheme, each of a center level of voltage levels corresponding to a first logical value 00b of the output data DOUT, a center level of voltage levels corresponding to a second logical value 01b of the output data DOUT, a center level of voltage levels corresponding to a third logical value 10b of the output data DOUT, and a center level of voltage levels corresponding to a fourth logical value 11b of the output data DOUT may be the reference voltage level.

For example, the reference voltage level, which is the center level of the voltage levels corresponding to the third logical value 10b, may correspond to the magnitude of the main cursor of the impulse response of the channel 820 or to the reference voltage level of the equalizer 930. The eye opening monitoring circuit 960 may calculate a reference voltage level of the voltage levels corresponding to the first logical value 00b, a reference voltage level of the voltage levels corresponding to the second logical value 01b, a reference voltage level of the voltage levels corresponding to the fourth logical value 11b by using the reference voltage level of the voltage levels which correspond to the third logical value 10b and are provided from the equalizer 930.

Voltage levels corresponding to any one of logical values of the output data DOUT may be distributed with respect to the reference voltage level as the center. The eye opening monitoring circuit 960 may measure the height of the eye opening based on a minimum level and the maximum level of the voltage levels.

The decoder 970 may receive the voltage levels of the output data DOUT provided from the equalizer 930. The decoder 970 may decode the voltage levels of the output data DOUT to symbols. The decoder 970 may provide the symbols to the logic circuit 980.

The logic circuit 980 may receive and process the symbols from the decoder 970. For example, for processing symbols, the logic circuit 980 may include at least one of a central processing unit (CPU), an image signal processing unit (ISP), a digital signal processing unit (DSP), a graphics processing unit (GPU), a vision processing unit (VPU), and a neural processing unit (NPU). Also, the logic circuit 980 may include homogeneous multi-core processors or heterogeneous multi-core processors.

The logic circuit 980 may receive the height of the eye opening from the eye opening monitoring circuit 960. The logic circuit 980 may adjust and/or optimize the equalizer 930 and the clock and data recovery circuit 940 based on the height of the eye opening.

For example, the logic circuit 980 may provide tuning information to the equalizer 930 and the clock and data recovery circuit 940 for training on the equalizer 930 and the clock and data recovery circuit 940. For example, coefficients (e.g., DFE coefficients) of the equalizer 930, coefficients of the clock and data recovery circuit 940, etc. may be changed depending on the tuning information (or one or more signals for tuning). For example, when it is determined that the height of the eye opening is insufficient, the logic circuit 980 may adjust the equalizer 930 and the clock and data recovery circuit 940 to improve the height of the eye opening.

In example embodiments, all or a part of the components of the receiver 900 may be implemented with a system on chip (SoC), an application specific integrated circuit (ASIC), a field programmable gate array (FPGA), etc.

Figure 25:
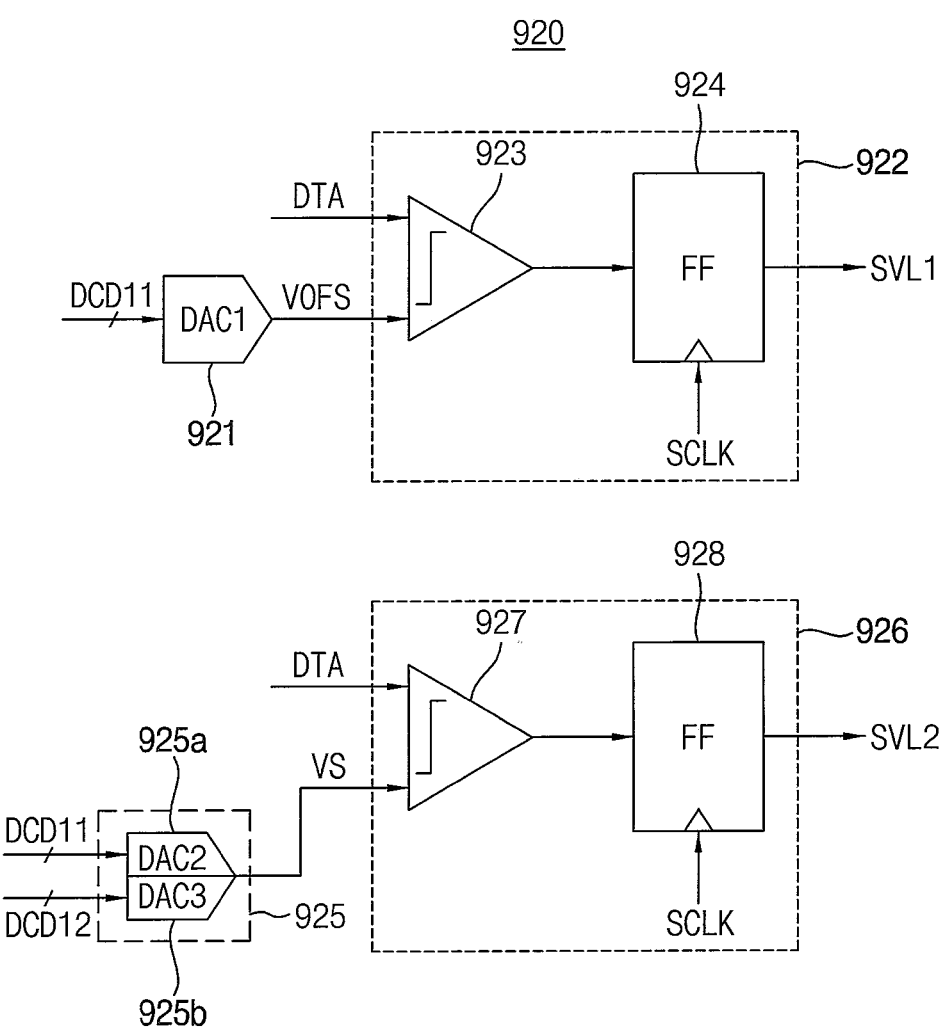
FIG. 25 illustrates an example of a sampling circuit in the receiver of FIG. 24 according to an embodiment.

FIG. 25 illustrates an example of the sampling circuit in the receiver of FIG. 24 according to an embodiment.

Referring to FIG. 25, the sampling circuit 920 may include a first DAC 921 (DAC1), a data sampler 922, a digital-to-analog conversion circuit 925 and an error sampler 926.

The first DAC 921 may convert a first digital code DCD11 associated with an offset voltage to an analog offset voltage VOFS corresponding to the first digital code DCD11. The data sampler 922 may include a first comparator 923 and a first flip-flop (FF) 924. The first comparator 923 may compare data DTA with the analog offset voltage VOFS to output a result of the comparison. The first flip-flop 924 may sample an output of the first comparator 923 based on the sampling clock SCLK to provide first voltage levels SVL1.

The digital-to-analog conversion circuit 925 may include a second DAC 925a (DAC2) and a third DAC 925b (DAC3). The second DAC 925a may convert the first digital code DCD11 to a corresponding analog voltage and the second DAC 925a may convert a second digital code DCD12 to a corresponding analog voltage. The digital-to-analog conversion circuit 925 may output a summed analog voltage VS corresponding to a sum of the first digital code DCD11 and the second digital code DCD12.

The error sampler 926 may include a second comparator 927 and a second flip-flop 928. The second comparator 927 may compare the data DTA with the summed analog voltage VS to output a result of the comparison. The second flip-flop 928 may sample an output of the second comparator 927 based on the sampling clock SCLK to provide second voltage levels SVL2.

Since the digital-to-analog conversion circuit 925 outputs the summed analog voltage VS by summing the first digital code DCD11 and the second digital code DCD12, the data sampler 922 and the error sampler 926 may have the same configuration.

According to the one or more embodiments, the digital-to-analog conversion circuit sums, at an output node, an a first analog signal and a second analog signal respectively corresponding to a first digital code and a second digital code received through different input terminals and provides one analog signal. Therefore, design of circuit elements connected to an output node of the digital-to-analog conversion circuit may be simplified.

The above described example embodiments may be applied to an electronic device including a DAC and an electronic system. For example, the one or more embodiments of the present disclosure may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The one or more embodiments described above are only for the purpose and should not to be construed as limiting the one or more embodiments of the disclosure. Although some example embodiments have been described, those skilled in the art will readily appreciate that various modifications, replacements, substitutions and equivalents thereof may be made in the example embodiments without materially departing from the scope and advantages of the present disclosure. Accordingly, all such modifications, replacements, substitutions and equivalents thereof shall fall within the scope of the present disclosure as defined in the claims.

What is claimed is:

1. A digital-to-analog conversion circuit comprising:
   a first digital-to-analog converter (DAC) comprising:
   a first binary-to-thermometer code converter (BTC) configured to convert a first digital code received through a first input terminal to a first thermometer code;
   a plurality of first current cells connected between a first voltage source and a first output node, and configured to provide a first current to the first output node based on the first thermometer code; and
   a first current-to-voltage converter directly connected between the first output node and a second voltage source; and
   a second DAC comprising:
   a second BTC configured to convert a second digital code received through a second input terminal to a second thermometer code;
   a plurality of second current cells connected between the first voltage source and the first output node in parallel with the plurality of first current cells, and configured to provide a second current to the first output node based on the second thermometer code; and
   a second current-to-voltage converter directly connected between the first output node and the second voltage source in parallel with the first current-to-voltage converter, wherein the first current-to-voltage converter and the second current-to-voltage converter are configured to convert a sum of the first current and the second current to a first analog voltage corresponding to a weighted sum of the first digital code and the second digital code, and output the first analog voltage at the first output node.

2. The digital-to-analog conversion circuit of claim 1, wherein, based on the first digital code corresponding to the second digital code,
a magnitude of the first current and a magnitude of the second current have a ratio of c:d, where c and d are positive real numbers,
the first digital code has a ratio of c/(c+d) in a maximum output range of the first analog voltage, and
the second digital code has a ratio of d/(c+d) in the maximum output range of the first analog voltage.

3. The digital-to-analog conversion circuit of claim 1, wherein:
the first BTC is further configured to generate a first inverted thermometer code which is inversely proportional to the first thermometer code and provide the first inverted thermometer code to the plurality of first current cells,
the plurality of first current cells are further configured to provide a first sub current to a second output node based on the first inverted thermometer code,
the second BTC is further configured to generate a second inverted thermometer code which is inversely proportional to the second thermometer code and provide the second inverted thermometer code to the plurality of second current cells,
the plurality of second current cells are further configured to provide a second sub current to the second output node based on the second inverted thermometer code, and
the first current-to-voltage converter and the second current-to-voltage converter are further configured to convert a sum of the first sub current and the second sub current to a second analog voltage corresponding to a complementary weighted sum of the first digital code and the second digital code, and output the second analog voltage at the second output node.

4. The digital-to-analog conversion circuit of claim 3, wherein the first voltage source provides a power supply voltage and the second voltage source provides a ground voltage,
wherein each of the plurality of first current cells comprises:
a first current source coupled to the power supply voltage, and configured to generate a first base current;
a first transistor including a first source coupled to a first internal node to receive the first base current, a first gate for receiving a bit from among bits of the first thermometer code and a first drain coupled to the first output node; and
a second transistor including a second source coupled to the first internal node to receive the first base current, a second gate for receiving a bit from among bits of the first inverted thermometer code and a second drain coupled to the second output node, and
wherein the first transistor and the second transistor are coupled in parallel with respect to the first internal node.

5. The digital-to-analog conversion circuit of claim 4, wherein each of the plurality of second current cells comprises:
a second current source coupled to the power supply voltage, and configured to generate a second base current;
a third transistor including a third source coupled to a second internal node to receive the second base current, a third gate for receiving a bit from among bits of the second thermometer code and a third drain coupled to the first output node; and
a fourth transistor including a fourth source coupled to the second internal node to receive the second base current, a fourth gate for receiving a bit from among bits of the second inverted thermometer code and a fourth drain coupled to the second output node,
wherein the third transistor and the fourth transistor are coupled in parallel with respect to the second internal node, and
wherein the first base current and the second base current have a ratio of c:d, where c and d are positive real numbers.

6. The digital-to-analog conversion circuit of claim 3, wherein the first voltage source provides a ground voltage and the second voltage source provides a power supply voltage,
wherein each of the plurality of first current cells comprises:
a first current source coupled to the ground voltage, and configured to generate a first base current;
a first transistor including a first source coupled to a first internal node to receive the first base current, a first gate for receiving a bit from among bits of the first thermometer code and a first drain coupled to the first output node; and
a second transistor including a second source coupled to the first internal node to receive the first base current, a second gate for receiving a bit from among bits of the first inverted thermometer code and a second drain coupled to the second output node, and
wherein the first transistor and the second transistor are coupled in parallel with respect to the first internal node.

7. The digital-to-analog conversion circuit of claim 6, wherein each of the plurality of second current cells comprises:
a second current source coupled to the ground voltage, and configured to generate a second base current;
a third transistor including a third source coupled to a second internal node to receive the second base current, a third gate for receiving a bit from among bits of the second thermometer code and a third drain coupled to the first output node; and
a fourth transistor including a fourth source coupled to the second internal node to receive the second base current, a fourth gate for receiving a bit from among bits of the second inverted thermometer code and a second electrode coupled to the second output node,
wherein the third transistor and the fourth transistor are coupled in parallel with respect to the second internal node, and
wherein the first base current and the second base current have a ratio of c:d, where c and d are positive real numbers.

8. The digital-to-analog conversion circuit of claim 3, wherein, based on the first digital code corresponding to the second digital code, a magnitude of the first current and a magnitude of the second current have a ratio of c:d, where c and d are positive real numbers, wherein the first current-to-voltage converter comprises:
 a first resistor connected between the first output node and the second voltage source; and
 a second resistor connected between the second output node and the second voltage source, and wherein the second current-to-voltage converter comprises:
 a third resistor connected between the first output node and the second voltage source; and
 a fourth resistor connected between the second output node and the second voltage source.

9. The digital-to-analog conversion circuit of claim 8, wherein:
 each of the first resistor and the second resistor has a first resistance,
 each of the third resistor and the fourth resistor has a second resistance, and
 a ratio of the first resistance and the second resistance is 1/c: 1/d.

10. The digital-to-analog conversion circuit of claim 9, wherein the first analog voltage has a fixed value irrespective of c and d in a common mode in which the first digital code and the second digital code have a same mean value.

11. The digital-to-analog conversion circuit of claim 3, further comprising:
 a third DAC comprising:
  a third BTC, configured to convert a third digital code received through a third input terminal to a third thermometer code;
  a plurality of third current cells connected between the first voltage source and the second output node in parallel with the plurality of second current cells, and configured to provide a third sub current to the first output node based on the third thermometer code; and
  a third current-to-voltage converter connected between the first output node and the second voltage source in parallel with the second current-to-voltage converter, and
 wherein the third current-to-voltage converter is configured to subtract an analog voltage corresponding to the third digital code from the first analog voltage, at the first output node.

12. A digital-to-analog conversion circuit comprising:
 a first digital-to-analog converter (DAC) comprising:
  a first current generation circuit (CGC) connected between a first voltage source and an output node, and configured to generate a first current based on a first digital code received through a first input terminal to provide the first current to the output node; and
  a first current-to-voltage converter directly connected between the output node and a second voltage source; and
 a second DAC comprising:
  a second CGC connected between the first voltage source and the output node in parallel with the first CGC, and configured to generate a second current based on a second digital code received through a second input terminal to provide the second current to the output node; and
  a second current-to-voltage converter directly connected between the output node and the second voltage source in parallel with the first current-to-voltage converter,
 wherein the first current-to-voltage converter and the second current-to-voltage converter are configured to convert a sum of the first current and the second current to an analog voltage corresponding to a sum of the first digital code and the second digital code, and output the analog voltage at the output node.

13. The digital-to-analog conversion circuit of claim 12, wherein, based on the first digital code corresponding to the second digital code, a magnitude of the first current is same as a magnitude of the second current,
wherein the first voltage source provides a power supply voltage and the second voltage source provides a ground voltage,
wherein the first CGC comprises:
 a plurality of first current sources connected to the power supply voltage in parallel with respect to each other, each of the plurality of first current sources being configured to provide a first base current; and
 a plurality of first transistors connected between respective one of the plurality of first current sources and the output node, each first gate of the plurality of first transistors receives respective bit from among bits of the first digital code,
wherein the second CGC comprises:
 a plurality of second current sources connected to the power supply voltage in parallel with respect to each other, each of the plurality of second current sources being configured to provide a second base current; and
 a plurality of second transistors connected between respective one of the plurality of second current sources and the output node, each second gate of the plurality of second transistors receives respective bit from among bits of the second digital code, and
wherein a magnitude of the first base current is the same as a magnitude of the second base current.

14. The digital-to-analog conversion circuit of claim 13, wherein the first current-to-voltage converter comprises a first resistor connected between the output node and the ground voltage,
wherein the second current-to-voltage converter comprises a second resistor connected between the output node and the ground voltage, and
wherein a resistance of the first resistor is same as a resistance of the second resistor.

15. The digital-to-analog conversion circuit of claim 12, wherein, based on the first digital code corresponding to the second digital code, a magnitude of the first current is the same as a magnitude of the second current,
wherein the first voltage source provides a ground voltage and the second voltage source provides a power supply voltage,
wherein the first CGC comprises:
 a plurality of first current sources connected to the ground voltage in parallel with respect to each other, each of the plurality of first current sources configured to provide a first base current; and
 a plurality of first transistors connected between respective one of the plurality of first current sources and the output node, each first gate of the plurality of first transistors receiving respective bit from among bits of the first digital code, wherein the second CGC comprises:
  a plurality of second current sources connected to the ground voltage in parallel with respect to each other, each of the plurality of second current sources configured to provide a second base current; and
  a plurality of second transistors connected between respective one of the plurality of second current sources and the output node, each second gate of the plurality of second transistors receiving respective bit from among bits of the second digital code, and
wherein a magnitude of the first base current is same as a magnitude of the second base current.

16. The digital-to-analog conversion circuit of claim 12, wherein, based on the first digital code corresponding to the second digital code,
  a ratio of a magnitude of the first current and a magnitude of the second current is c:d, where c and d are positive real numbers.

17. The digital-to-analog conversion circuit of claim 16, wherein the first CGC comprises:
  a plurality of first current sources connected to the first voltage source in parallel with respect to each other, each of the plurality of first current sources configured to provide a first base current; and
  a plurality of first transistors connected between respective one of the plurality of first current sources and the output node, each first gate of the plurality of first transistors receiving respective bit from among bits of the first digital code,
wherein the second CGC comprises:
  a plurality of second current sources connected to the first voltage source in parallel with respect to each other, each of the plurality of second current sources configured to provide a second base current; and
  a plurality of second transistors connected between respective one of the plurality of second current sources and the output node, each second gate of the plurality of second transistors receiving respective bit from among bits of the second digital code, and
wherein a ratio of a magnitude of the first base current and a magnitude of the second base current is c:d.

18. The digital-to-analog conversion circuit of claim 16, wherein the first current-to-voltage converter comprises a first resistor connected between the output node and the second voltage source,
wherein the second current-to-voltage converter comprises a second resistor connected between the output node and the second voltage source, and
wherein a ratio of a resistance of the first resistor and a resistance of the second resistor is 1/c:1/d.

* * * * *